(12) United States Patent
Watanabe et al.

(10) Patent No.: US 10,636,733 B2
(45) Date of Patent: Apr. 28, 2020

(54) WIRING SUBSTRATE

(71) Applicant: SHINKO ELECTRIC INDUSTRIES CO., LTD., Nagano-shi, Nagano-ken (JP)

(72) Inventors: Shoji Watanabe, Nagano (JP); Ken Miyairi, Nagano (JP)

(73) Assignee: SHINKO ELECTRIC INDUSTRIES CO., LTD. (JP)

( * ) Notice: Subject to any disclaimer, the term of this patent is extended or adjusted under 35 U.S.C. 154(b) by 0 days.

(21) Appl. No.: 16/392,687

(22) Filed: Apr. 24, 2019

(65) Prior Publication Data
US 2019/0333847 A1    Oct. 31, 2019

(30) Foreign Application Priority Data

Apr. 27, 2018 (JP) ................................. 2018-087609

(51) Int. Cl.
*H01L 23/498* (2006.01)
*H01L 21/48* (2006.01)
(Continued)

(52) U.S. Cl.
CPC ...... *H01L 23/49822* (2013.01); *H01L 21/486* (2013.01); *H01L 21/4853* (2013.01); *H01L 21/4857* (2013.01); *H01L 21/6835* (2013.01); *H01L 23/13* (2013.01); *H01L 23/145* (2013.01); *H01L 23/49833* (2013.01); *H01L 23/49838* (2013.01); *H01L 24/16* (2013.01); *H01L 2221/68345* (2013.01); *H01L 2221/68359* (2013.01); *H01L 2221/68372* (2013.01);
(Continued)

(58) Field of Classification Search
CPC combination set(s) only.
See application file for complete search history.

(56) References Cited

U.S. PATENT DOCUMENTS 4,285,780 A * 8/1981 Schachter .............. H05K 3/423
205/120
5,834,844 A * 11/1998 Akagawa ............ H01L 23/3107
257/734
(Continued)

FOREIGN PATENT DOCUMENTS

| JP | 2013-214579 A | 10/2013 |
| JP | 2014-110390 A | 6/2014 |
| KR | 20150004120 A * | 1/2015 |

*Primary Examiner* — William H. Mayo, III
*Assistant Examiner* — Krystal Robinson
(74) *Attorney, Agent, or Firm* — Tarolli, Sundheim, Covell & Tummino LLP

(57) ABSTRACT

A wiring substrate includes a stack having a plurality of insulation layers and a plurality of wiring layers. Each of the plurality of insulation layer is formed by an insulative resin of which main component is a photosensitive resin. The plurality of insulation layers and the plurality of wiring layers are alternately stacked one upon another. The wiring substrate further includes a first insulation layer covering a lower surface of the stack and entirely covering a side surface of the stack. The first insulation layer has a higher rigidity than the plurality of insulation layers. An upper surface of the uppermost one of the plurality of wiring layers and an upper surface of the uppermost one of the plurality of insulation layers are exposed from the first insulation layer.

12 Claims, 28 Drawing Sheets

(51) Int. Cl.
*H01L 21/683* (2006.01)
*H01L 23/13* (2006.01)
*H01L 23/14* (2006.01)
*H01L 23/00* (2006.01)

(52) U.S. Cl.
CPC ............... *H01L 2224/13144* (2013.01); *H01L 2224/16227* (2013.01); *H01L 2924/3511* (2013.01)

(56) References Cited

U.S. PATENT DOCUMENTS

| | | | | |
|---|---|---|---|---|
| 6,255,737 | B1* | 7/2001 | Hashimoto | H01L 21/768 257/784 |
| 6,987,325 | B2* | 1/2006 | Corisis | H01L 25/0657 257/786 |
| 7,692,278 | B2* | 4/2010 | Periaman | H01L 21/563 257/686 |
| 9,059,187 | B2* | 6/2015 | Furutani | H01L 21/568 |
| 9,263,373 | B2* | 2/2016 | Hu | H01L 21/4825 |
| 9,536,801 | B2* | 1/2017 | Furutani | H01L 21/568 |
| 2003/0011738 | A1* | 1/2003 | Akiyama | H01L 21/6835 349/156 |
| 2003/0146012 | A1* | 8/2003 | Song | H01L 25/0657 174/538 |
| 2004/0184219 | A1* | 9/2004 | Otsuka | H01L 23/49805 361/306.3 |
| 2004/0194999 | A1* | 10/2004 | Tomita | H01L 23/49816 174/250 |
| 2006/0219429 | A1* | 10/2006 | Ikumo | H01L 21/481 174/258 |
| 2007/0023887 | A1* | 2/2007 | Matsui | H01L 24/73 257/686 |
| 2007/0218678 | A1* | 9/2007 | Suh | H01L 21/76898 438/622 |
| 2008/0012120 | A1* | 1/2008 | Sunohara | H01L 23/49822 257/698 |
| 2009/0011250 | A1* | 1/2009 | Pater | H01B 3/306 428/435 |
| 2009/0095518 | A1* | 4/2009 | Matsushita | H01L 21/481 174/261 |
| 2009/0107703 | A1* | 4/2009 | Abe | H01L 23/49822 174/254 |
| 2009/0114428 | A1* | 5/2009 | Ueno | H05K 3/28 174/254 |
| 2009/0289030 | A1* | 11/2009 | Ueno | H05K 3/0035 216/17 |
| 2011/0019125 | A1* | 1/2011 | Nakahama | H01L 23/4985 349/58 |
| 2011/0209910 | A1* | 9/2011 | Maeda | H05K 3/4682 174/261 |
| 2012/0153445 | A1* | 6/2012 | Son | H01L 23/3128 257/668 |
| 2014/0347822 | A1* | 11/2014 | Mizushiro | H05K 3/3452 361/746 |
| 2017/0164481 | A1* | 6/2017 | Stahr | H05K 3/46 |
| 2018/0047661 | A1* | 2/2018 | Oshima | H01L 21/4857 |
| 2018/0122736 | A1* | 5/2018 | Hu | H01L 23/49838 |
| 2018/0350745 | A1* | 12/2018 | Hsieh | H01L 23/53238 |
| 2019/0096824 | A1* | 3/2019 | Hur | H01L 23/49827 |
| 2019/0096825 | A1* | 3/2019 | Kim | H01L 23/16 |

\* cited by examiner

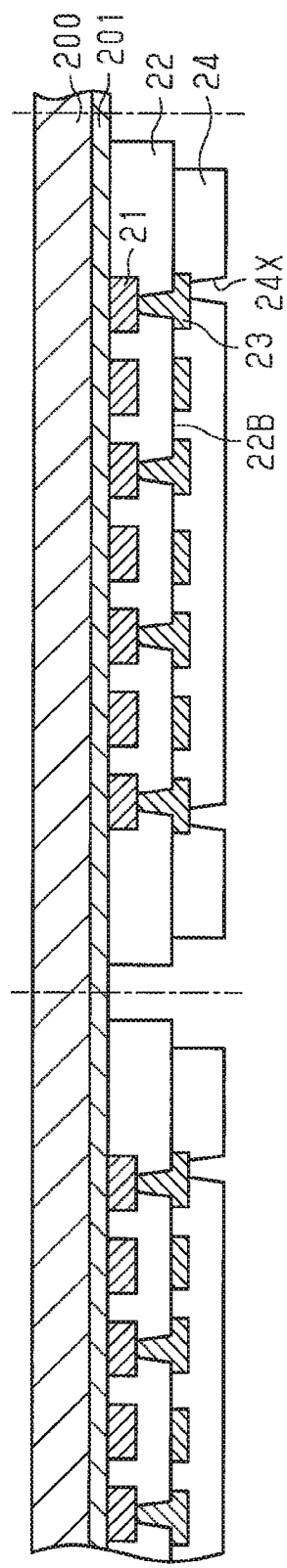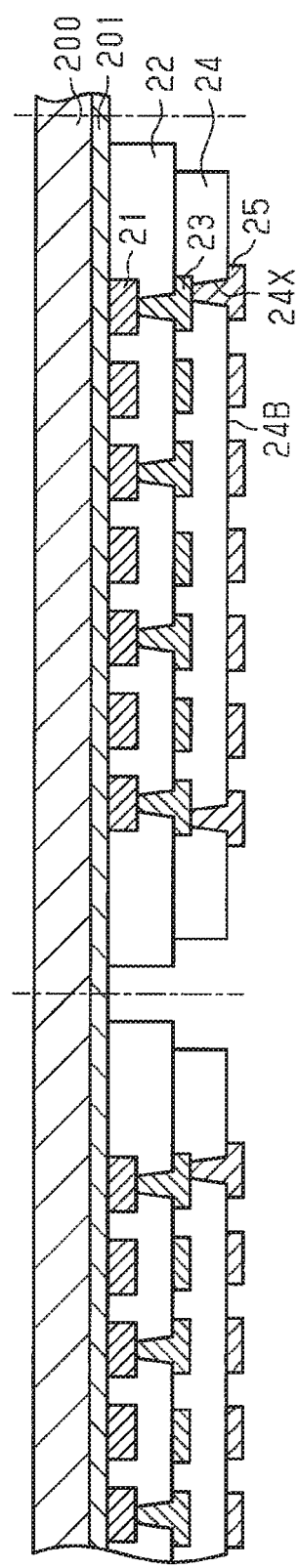

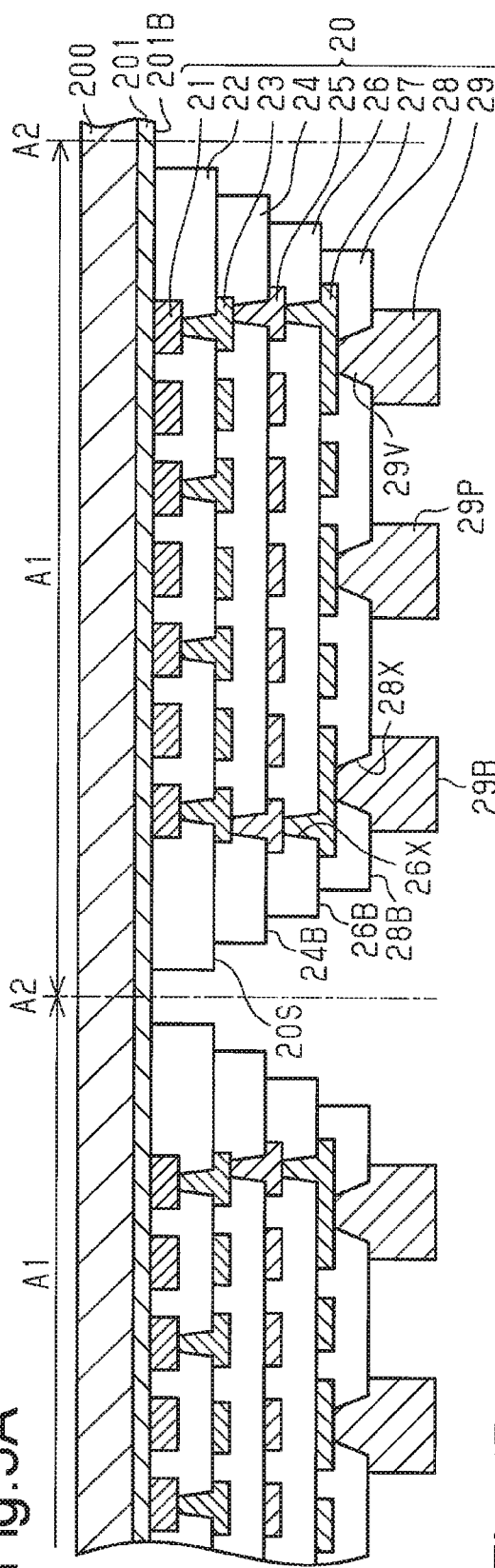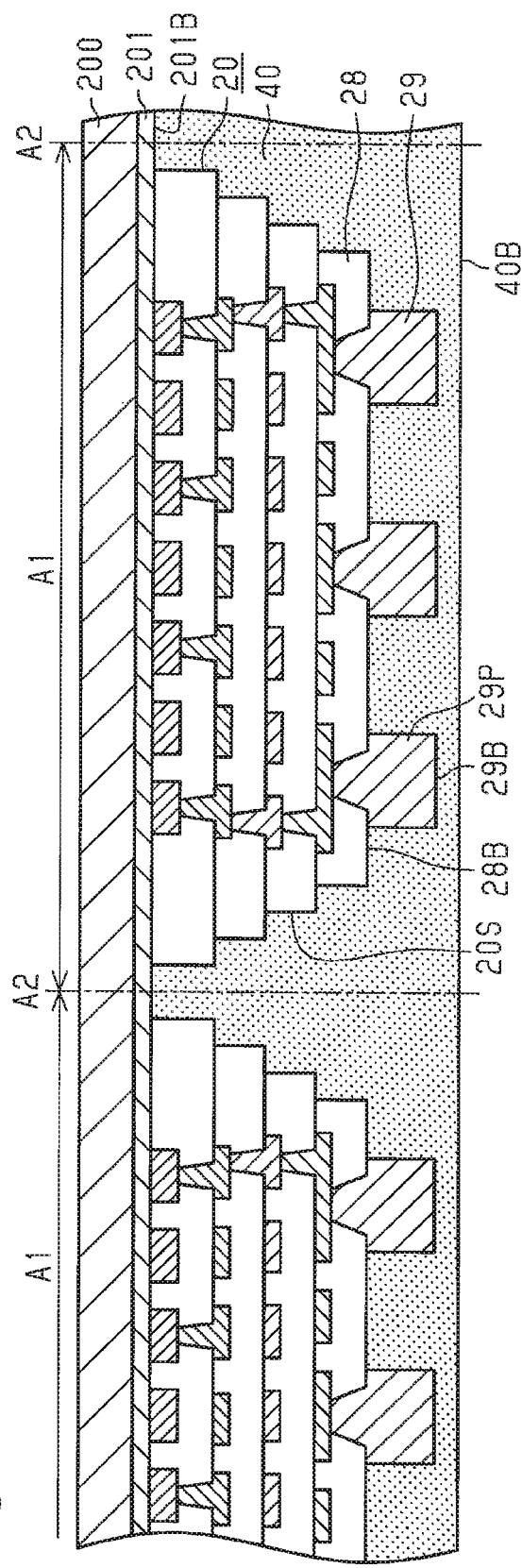

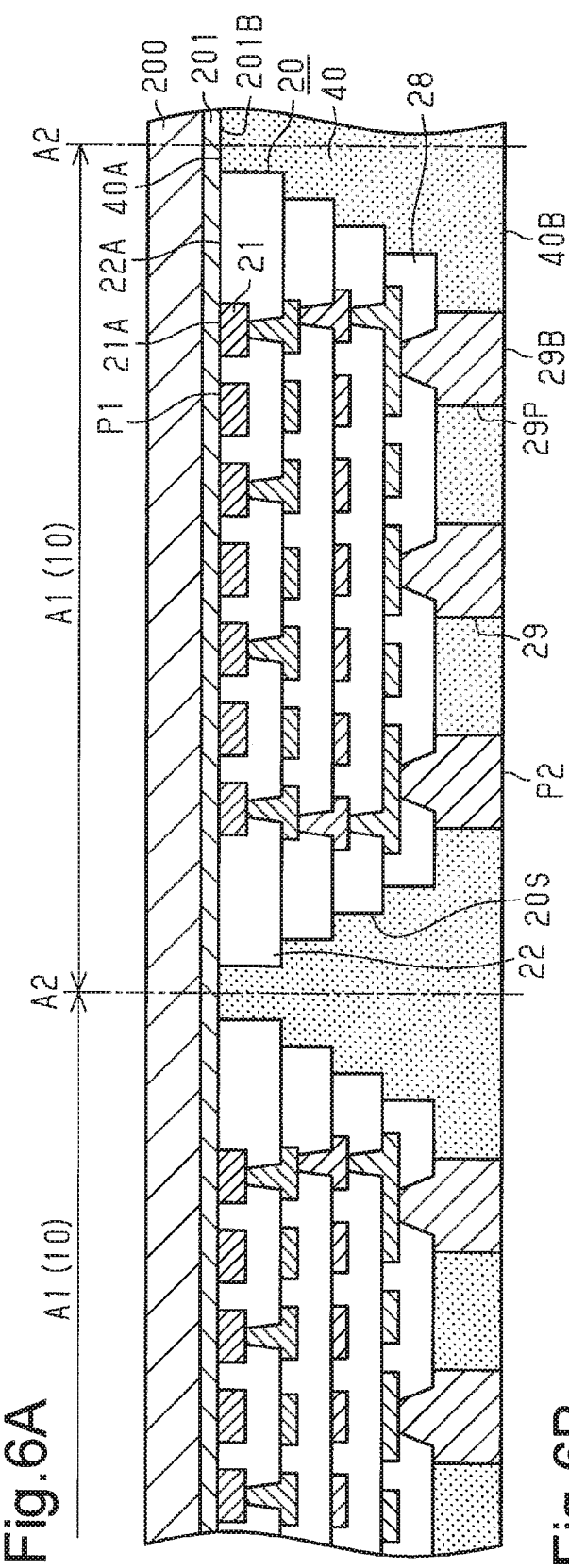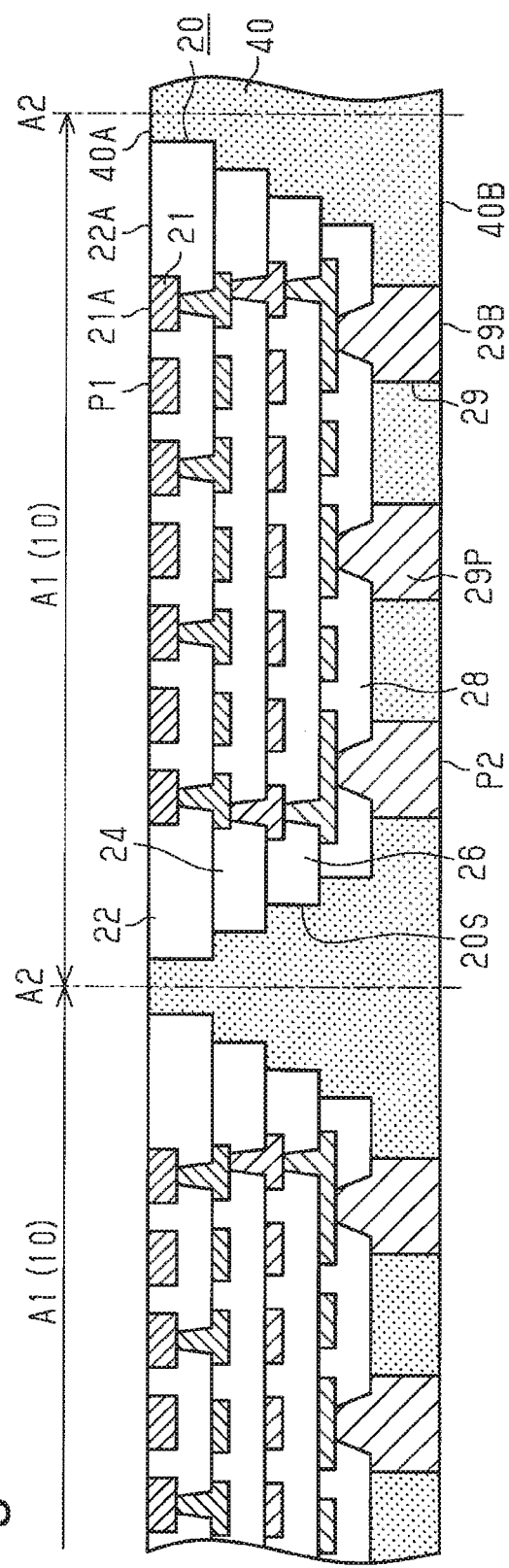

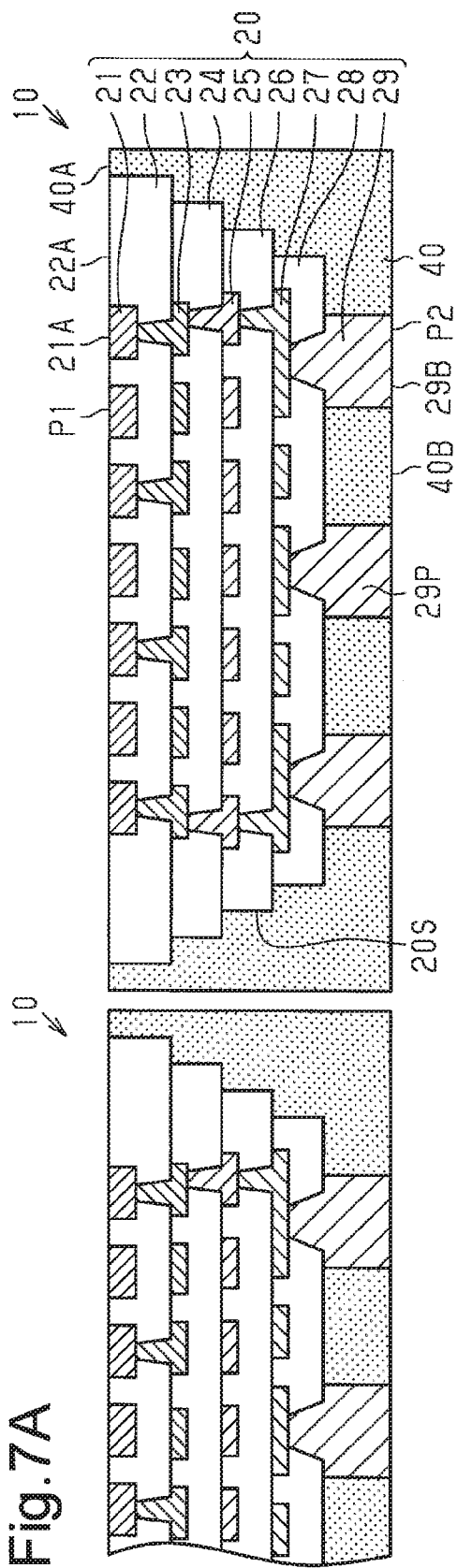
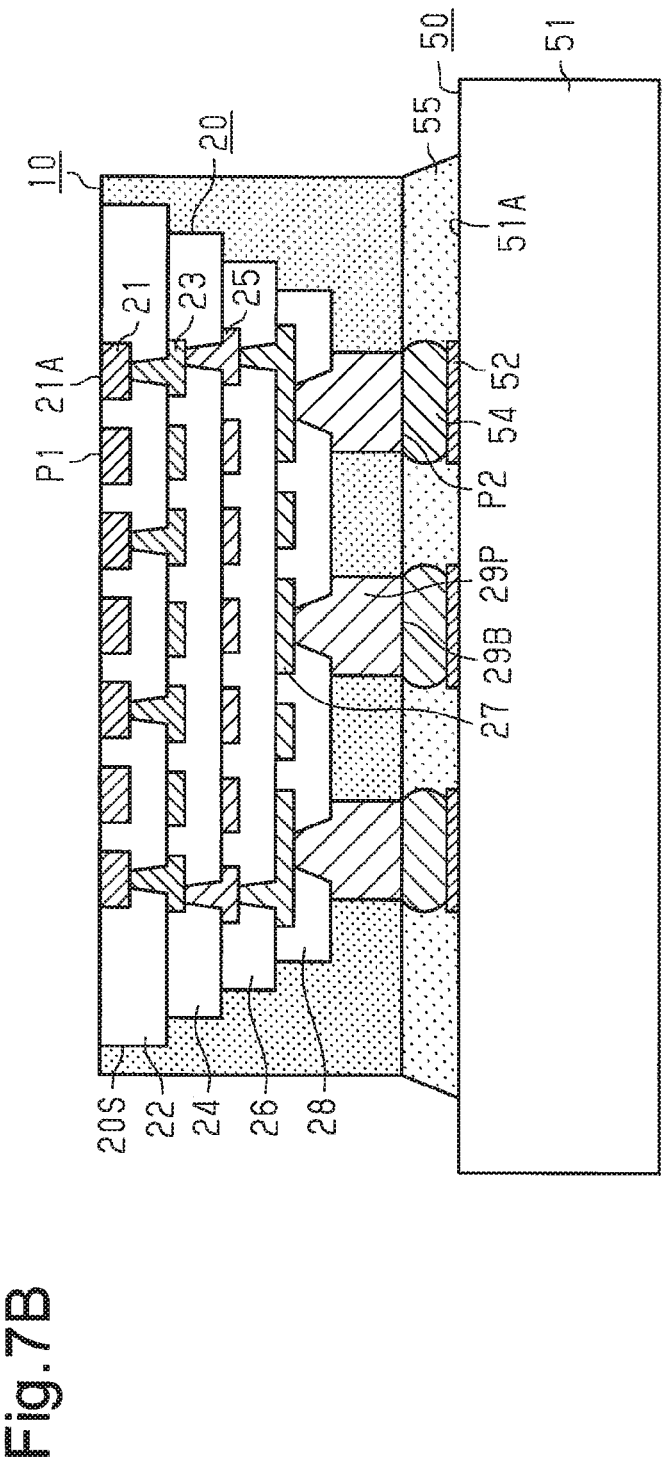
Fig.7A
Fig.7B

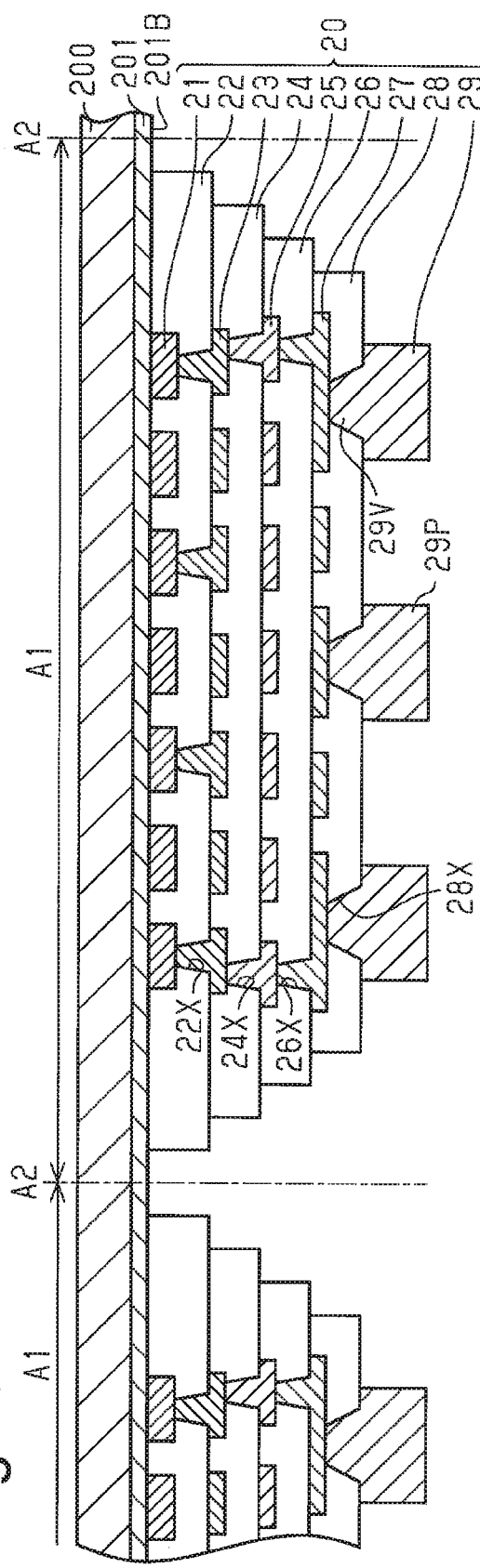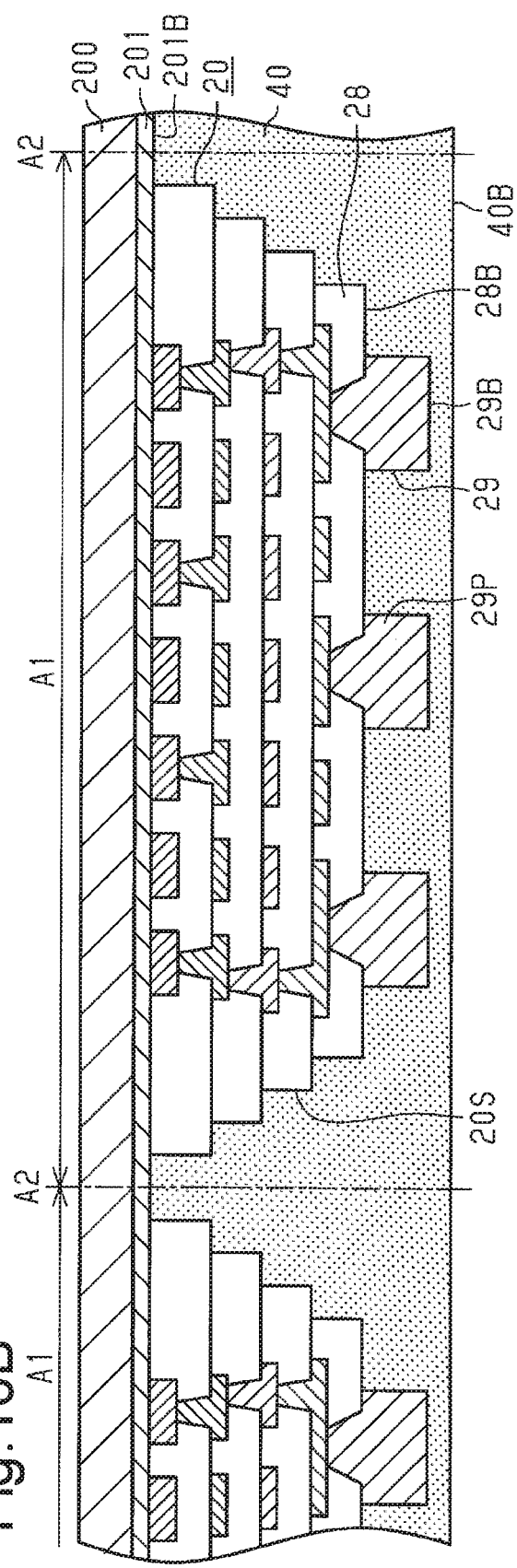

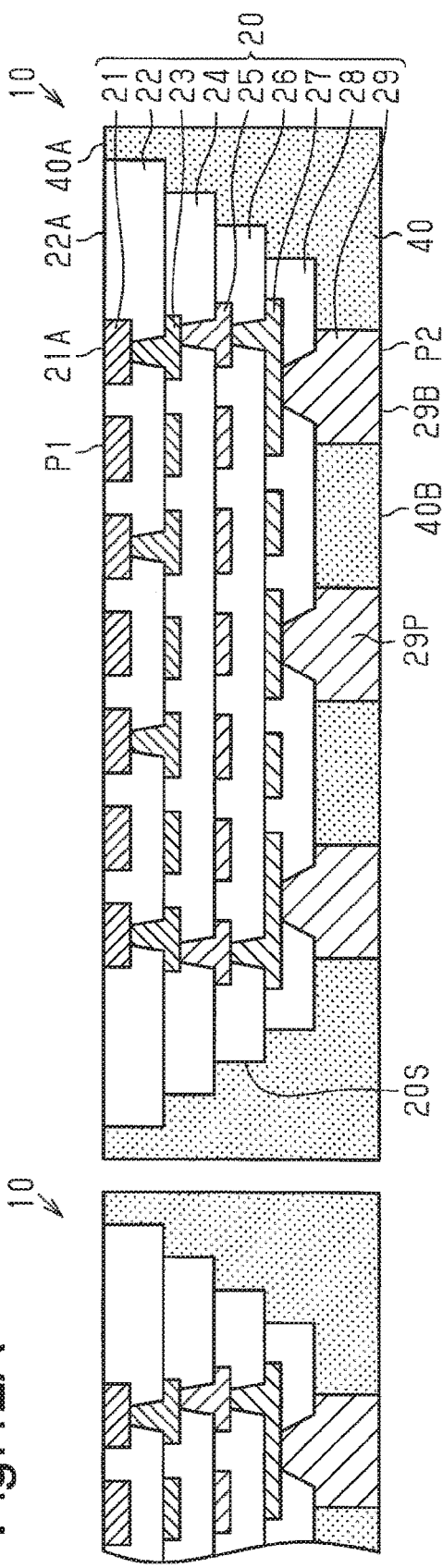
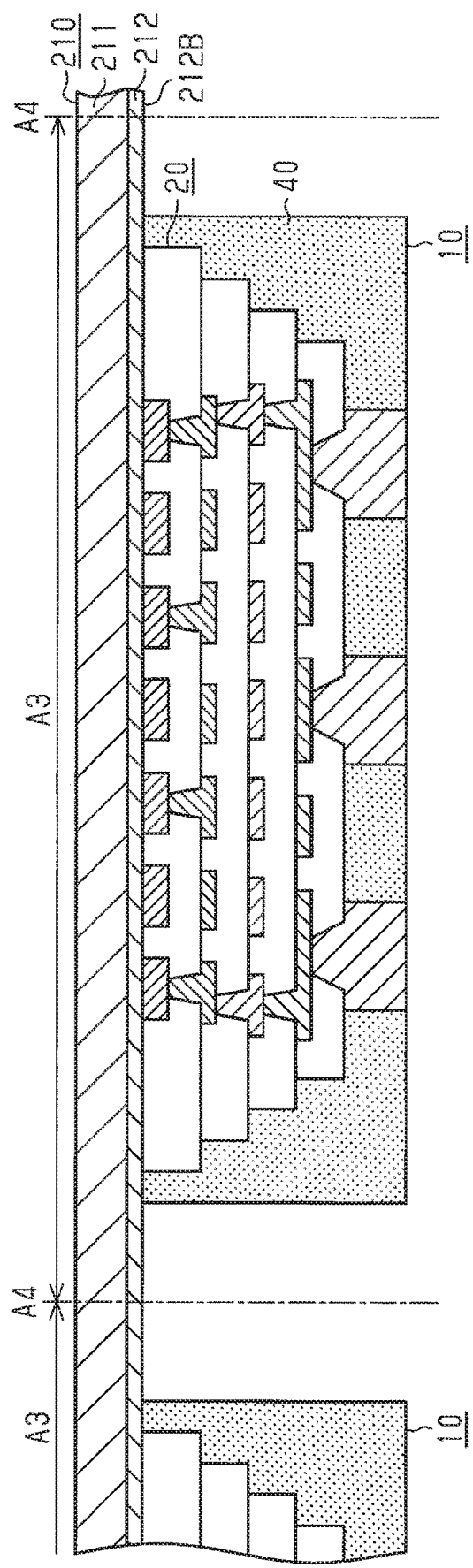
Fig. 12A
Fig. 12B

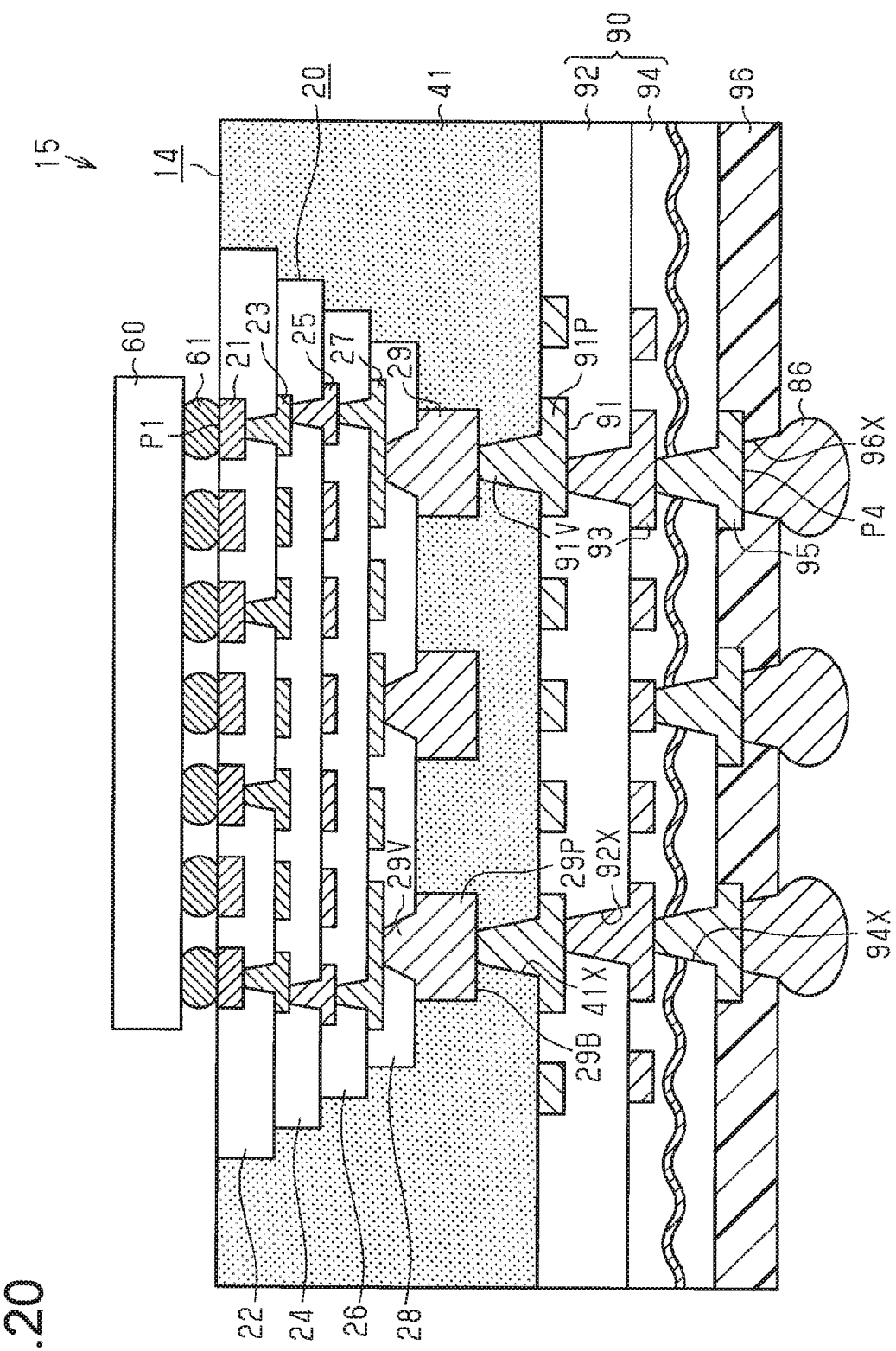

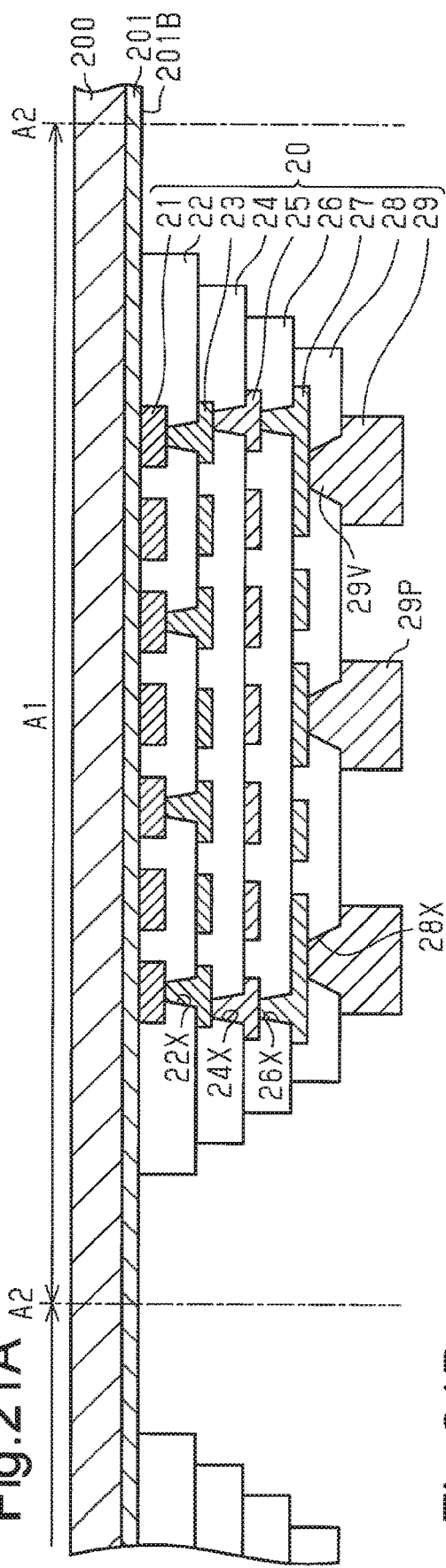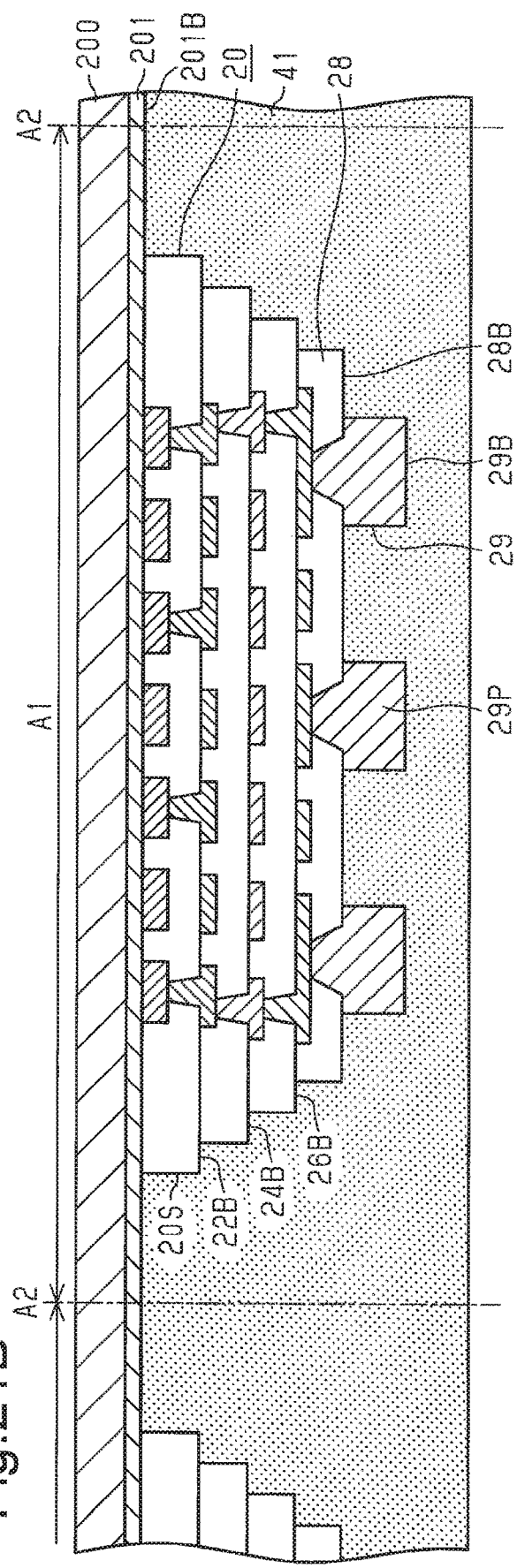

WIRING SUBSTRATE

CROSS-REFERENCE TO RELATED APPLICATIONS

This application is based upon and claims the benefit of priority from prior Japanese Patent Application No. 2018-087609, filed on Apr. 27, 2018, the entire contents of which are incorporated herein by reference.

FIELD

This disclosure relates to a wiring substrate and a method for manufacturing a wiring substrate.

BACKGROUND

A wiring substrate such as an interposer electrically connects a semiconductor chip to a semiconductor package substrate or electrically connects semiconductor chips to each other (refer to Japanese Laid-Open Patent Publication Nos. 2014-110390 and 2013-214579). Such a wiring substrate has, for example, one surface including a connection terminal connected to a semiconductor chip and another surface including a connection terminal connected to a package substrate. In the wiring substrate, wiring layers, which electrically connect the two connection terminals, and interlayer insulation layers are alternately stacked.

The scale of semiconductor chip integration has resulted in the demand for thinner wiring substrates and higher wiring pattern density. A thin wiring substrate has been developed to meet such demands. Such a thin wiring substrate may be obtained by forming an interlayer insulation layer with a thin film of a photosensitive resin such as a polyimide resin and omitting a core substrate (support member), which has high rigidity and is thicker than the interlayer insulation layer.

SUMMARY

However, a thin wiring substrate easily warps because of the low rigidity of the thin film (interlayer insulation layer) of photosensitive resin. This hinders handling of the thin wiring substrate in the manufacturing process.

One embodiment of a wiring substrate includes a stack and a first insulation layer. The stack includes a plurality of insulation layers and a plurality of wiring layers. Each of the plurality of insulation layers is formed by an insulative resin of which main component is a photosensitive resin, and the plurality of insulation layers and the plurality of wiring layers are alternately stacked one upon another. The first insulation layer covers a lower surface of the stack and entirely covers a side surface of the stack. The first insulation layer has a higher rigidity than the plurality of insulation layers. An upper surface of an uppermost wiring layer of the plurality of wiring layers and an upper surface of an uppermost insulation layer of the plurality of insulation layers are exposed from the first insulation layer.

Other embodiments and advantages thereof will become apparent from the following description, taken in conjunction with the accompanying drawings, illustrating by way of example the principles of the invention.

It is to be understood that both the foregoing general description and the following detailed description are exemplary and explanatory and are not restrictive of the invention, as claimed.

BRIEF DESCRIPTION OF THE DRAWINGS

The embodiments, together with objects and advantages thereof, may best be understood by reference to the following description of the presently preferred embodiments together with the accompanying drawings in which:

FIGS. 3A to 3C, 4A, 4B, 5A, 5B, 6A, 6B, and 7A are schematic cross-sectional views illustrating a method for manufacturing the wiring substrate of FIG. 1;

FIG. 7B is a schematic cross-sectional view illustrating the method for manufacturing the semiconductor device of FIG. 2 following the step illustrated in FIG. 7A;

FIGS. 10A, 10B, 11A, 11B, 12A, 12B, and 13 to 18 are schematic cross-sectional views illustrating a method for manufacturing the wiring substrate of FIG. 8;

FIG. 20 is a schematic cross-sectional view of a semiconductor device including the wiring substrate of FIG. 19;

FIGS. 21A, 21B, and 22 to 25 are schematic cross-sectional views illustrating a method for manufacturing the wiring substrate of FIG. 19;

DESCRIPTION OF THE EMBODIMENTS

Figure 1:
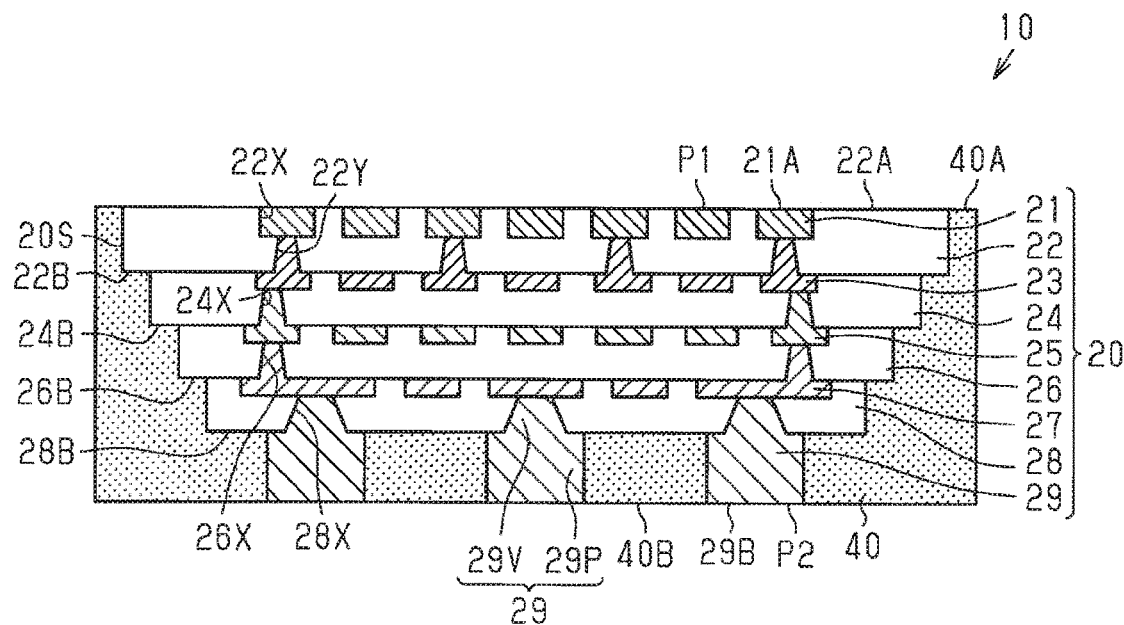
FIG. 1 is a schematic cross-sectional view of a wiring substrate in accordance with a first embodiment.

Various embodiments will now be described with reference to the accompanying drawings. Elements in the drawings may be partially enlarged for simplicity and clarity and thus have not necessarily been drawn to scale. To facilitate understanding, hatching lines may not be illustrated in the cross-sectional drawings.

First Embodiment

A first embodiment will now be described with reference to FIGS. 1 to 7B.

As illustrated in FIG. 1, a wiring substrate 10 includes a stack 20 and an insulation layer 40 covering a lower surface of the stack 20 and entirely covering side surfaces 20S of the stack 20.

The stack 20 includes wiring layers 21, 23, 25, 27, and 29 and insulation layers 22, 24, 26, and 28 that are alternately stacked one upon another. The wiring layer 21, the insulation layer 22, the wiring layer 23, the insulation layer 24, the wiring layer 25, the insulation layer 26, the wiring layer 27, the insulation layer 28, and the wiring layer 29 are alternately stacked in the stack 20 of the present example. The stack 20 of the first embodiment is a coreless substrate that does not include a core substrate (support substrate) and differs from a cored build-up substrate that includes a given number of build-up layers formed on one or both surfaces of the core substrate through a typical build-up process.

The material of the wiring layers 21, 23, 25, 27, and 29 may be, for example, copper (Cu) or a copper alloy. The material of the insulation layers 22, 24, 26, and 28 may be, for example, an insulative resin of which main component is a photosensitive resin such as a phenol resin or a polyimide resin. The insulation layers 22, 24, 26, and 28 may include, for example, a filler such as silica or alumina. The insulation layers 22, 24, 26, and 28 may each have a thickness of, for example, approximately 3 to 10 μm.

The stack 20 has an outermost layer (uppermost layer as viewed in FIG. 1) including the wiring layer 21 and an opposite outermost layer (lowermost layer as viewed in FIG. 1) including the wiring layer 29. In the description hereafter, the wiring layer 21 may be referred to as the uppermost wiring layer 21, and the wiring layer 29 may be referred to as the lowermost wiring layer 29. The uppermost wiring layer 21 is finer than the lowermost wiring layer 29. The wiring layer 21 has a smaller wiring width and wiring interval than the wiring layer 29. The line-and-space (L/S) of the wiring layer 21 may be, for example, approximately 2 μm/2 μm to 3 μm/3 μm. The line-and-space indicates the wiring width (L) and the wiring interval of adjacent wiring (S). The wiring layer 21 may have a thickness of, for example, approximately 1 to 5 μm.

The outermost layer (uppermost layer as viewed in FIG. 1) of the stack 20 includes the insulation layer 22, and the opposite outermost layer (lowermost layer in FIG. 1) includes the insulation layer 28. In the description hereafter, the insulation layer 22 may be referred to as the uppermost insulation layer 22 of the stack 20, and the insulation layer 28 may be referred to as the lowermost insulation layer 28 of the stack 20. The insulation layer 22 covers the lower surface and side surfaces of the wiring layer 21 and exposes an upper surface 21A of the wiring layer 21. The insulation layer 22 has an upper surface 22A that is flush with the upper surface 21A of the wiring layer 21. The upper surface 22A of the insulation layer 22 includes recesses 22X at given locations. The recesses 22X are recessed toward a lower surface 22B of the insulation layer 22. Each recess 22X is deep enough to extend from the upper surface 22A of the insulation layer 22 to an intermediate position in the thickness-wise direction of the insulation layer 22. The recesses 22X are filled with the wiring layer 21.

The upper surface 21A of the wiring layer 21 exposed from the insulation layer 22 function as connection pads P1 electrically connected to a semiconductor chip 60 (refer to FIG. 2) or the like. In the example of FIG. 1, the upper surface of the wiring substrate 10 where the connection pads P1 are formed function as a chip-mounting surface.

The insulation layer 22 includes through holes 22Y. The through holes 22Y open at given locations in the lower surface 22B of the insulation layer 22 and extend through the insulation layer 22 in the thickness-wise direction to expose portions of the lower surface of the wiring layer 21.

The wiring layer 23 is formed on the lower surface 22B of the insulation layer 22 and electrically connected to the wiring layer 21. The wiring layer 23 includes, for example, via wirings and wiring patterns. The through holes 22Y are filled with the via wirings. The wiring patterns are formed integrally with the via wirings and laid out on the lower surface 22B of the insulation layer 22.

The insulation layer 24 is formed on the lower surface 22B of the insulation layer 22 covering the wiring layer 23. The outer side surfaces of the insulation layer 24 are located toward the inner side of the stack 20 from the outer side surfaces of the insulation layer 22. Thus, the outer dimensions (planar size) of the insulation layer 24 are slightly smaller than the outer dimensions (planar size) of the insulation layer 22. The insulation layer 24 exposes the peripheral portion of the lower surface 22B of the insulation layer 22 in a frame-like (annular) manner. The insulation layer 24 includes through holes 24X at given locations. The through holes 24X extend through the insulation layer 24 in the thickness-wise direction and expose portions of the lower surface of the wiring layer 23.

The wiring layer 25 is formed on a lower surface 24B of the insulation layer 24. The wiring layer 25 is electrically connected to the wiring layer 23. The wiring layer 25 includes, for example, via wirings and wiring patterns. The through holes 24X are filled with the via wirings, and the wiring patterns are laid out on the lower surface 24B of the insulation layer 24.

The insulation layer 26 is formed on the lower surface 24B of the insulation layer 24 covering the wiring layer 25. The outer side surfaces of the insulation layer 26 are located toward the inner side of the stack 20 from the outer side surfaces of the insulation layer 24. Thus, the outer dimensions of the insulation layer 26 are slightly smaller than the outer dimensions of the insulation layer 24. The insulation layer 26 exposes the peripheral portion of the lower surface 24B of the insulation layer 24 in a frame-like manner. The insulation layer 26 includes through holes 26X at given locations. The through holes 26X extend through the insulation layer 26 in the thickness-wise direction and expose portions of the lower surface of the wiring layer 25.

The wiring layer 27 is formed on a lower surface 26B of the insulation layer 26. The wiring layer 27 is electrically connected to the wiring layer 25. The wiring layer 27 includes, for example, via wirings and wiring patterns. The through holes 26X are filled with the via wirings, and the wiring patterns are laid out on the lower surface 26B of the insulation layer 26.

The wiring widths and the wiring intervals of the wiring layers 23, 25, and 27 are, for example, smaller than the wiring width and the wiring interval of the wiring layer 29. The line-and-space (L/S) of each of the wiring layers 23, 25, and 27 may be, for example, approximately 2 μm/2 μm to 3 μm/3 μm. The wiring layers 23, 25, and 27 respectively formed on the lower surfaces 22B, 24B, and 26B of the insulation layers 22, 24, and 26 may have a thickness of, for example, approximately 1 to 5 μm.

The insulation layer 28 is formed on the lower surface 26B of the insulation layer 26 covering the wiring layer 27. The outer side surfaces of the insulation layer 28 are located toward the inner side of the stack 20 from the outer side surfaces of the insulation layer 26. Thus, the outer dimensions of the insulation layer 28 are slightly smaller than the outer dimensions of the insulation layer 26. The insulation layer 28 exposes the peripheral portion of the lower surface 26B of the insulation layer 26 in a frame-like manner. The insulation layer 28 includes through holes 28X at given locations. The through holes 28X extend through the insulation layer 28 in the thickness-wise direction and partially expose the lower surface of the wiring layer 27.

In this manner, the side surfaces 20S of the stack 20 are stepped. In the example of FIG. 1, the side surfaces 20S of the stack 20 are stepped by the side surfaces and the lower surface 22B of the insulation layer 22, the side surfaces and the lower surface 24B of the insulation layer 24, the side surfaces and the lower surface 26B of the insulation layer 26, and the side surfaces and a lower surface 28B of the insulation layer 28. The steps are formed in a frame-like manner in the side surfaces 20S over the entire periphery of the stack 20.

The through holes 22Y, 24X, 26X, and 28X of the present example are each tapered so that the diameter decreases from the lower side (side of wiring layer 29) toward the upper side (side of the wiring layer 21) as viewed in FIG. 1. For example, the through holes 22Y, 24X, 26X, and 28X each have the form of a substantially truncated conical hole of which the lower open end has a larger diameter than the upper open end. The diameter of the upper open end of each of the through holes 22Y, 24X, 26X, and 28X is, for example, approximately 5 to 10 µm.

The wiring layer 29 is formed on the lower surface 28B of the insulation layer 28. The wiring layer 29 is electrically connected to the wiring layer 27. The wiring layer 29 includes via wirings 29V and connection terminals 29P. The through holes 28X are filled with the via wirings 29V. The connection terminals 29P project downward from the lower surface 28B of the insulation layer 28. The via wirings 29V are, for example, formed integrally with the connection terminals 29P. The connection terminals 29P are, for example, cylindrical connection terminals (metal posts) extending downward from the lower surface 28B of the insulation layer 28. The connection terminals 29P are thicker than the other wiring layers 21, 23, 25, and 27 in the stack 20. The thickness of each connection terminal 29P may be, for example, approximately 5 to 30 µm. The connection terminals 29P may be of any shape and size in a plan view. The connection terminal 29P is, for example, larger than the lower surface of the via wiring 29V in a plan view. Each connection terminal 29P may be circular in a plan view and have a diameter of approximately 10 to 40 µm. The pitch of the connection terminals 29P is, for example, approximately 30 to 50 µm.

Each connection terminal 29P has a lower surface 29B exposed from the insulation layer 40. The lower surface 29B of each connection terminal 29P, which is exposed from the insulation layer 40, functions as a substrate connection pad P2 electrically connected to another wiring substrate 50 (refer to FIG. 2), which is a package substrate.

A surface-processed layer may be formed on the surfaces (lower surfaces 29B) of the connection terminals 29P. Examples of the surface-processed layer includes a gold (Au) layer, a nickel (Ni) layer/Au layer (metal layer in which Ni layer and Au layer are sequentially stacked with Ni layer serving as bottom layer), and Ni layer/palladium (Pd) layer/ Au layer (metal layer in which Ni layer, Pd layer, and Au layer are sequentially stacked with Ni layer serving as bottom layer). The Ni layer, Au layer, and Pd layer may each be, for example, an electroless plating metal layer formed in an electroless plating process. The Ni layer is a metal layer of Ni or a Ni alloy. The Au layer is a metal layer of Au or an Au alloy. The Pd layer is a metal layer of Pd or a Pd alloy. The surface (lower surface 29B) of each connection terminal 29P may undergo an anti-oxidation process such as an organic solderability preservative (OSP) process to form a surface-processed layer.

The insulation layer 40 covers the lower surface of the stack 20S and entirely covers the side surfaces 20S of the stack 20. The insulation layer 40 exposes the upper surface of the stack 20. In the present example, the insulation layer 40 entirely covers the side surfaces 20S of the stack 20 that are stepped, that is, the surfaces of the insulation layers 22, 24, 26, and 28 that form the steps. In the example of FIG. 1, the insulation layer 40 entirely covers the side surfaces 20S of the stack 20 that include the side surfaces and the lower surface 22B of the insulation layer 22, the side surfaces and the lower surface 24B of the insulation layer 24, the side surfaces and the lower surface 26B of the insulation layer 26, and the side surfaces and the lower surface 28B of the insulation layer 28.

The insulation layer 40 partially covers the lower surface of the stack 20. In the example of FIG. 1, the insulation layer 40 entirely covers the lower surface 28B of the lowermost insulation layer 28 in the stack 20 and exposes the lower surface 29B of each connection terminal 29P. A lower surface 40B of the insulation layer 40 is flush with, for example, the lower surface 29B of the wiring layer 29. The insulation layer 40, for example, entirely covers and contacts the side surfaces of the connection terminals 29P. That is, the insulation layer 40 is formed to surround the connection terminals 29P. In other words, the connection terminals 29P extend in the thickness-wise direction through the portion of the insulation layer 40 covering the lower surface 28B of the insulation layer 28.

The insulation layer 40 entirely exposes the upper surface of the stack 20. In the example of FIG. 1, the insulation layer 40 entirely exposes the upper surface 21A of the wiring layer 21 and the upper surface 22A of the insulation layer 22. An upper surface 40A of the insulation layer 40 is flush with, for example, the upper surface 21A of the wiring layer 21 and the upper surface 22A of the insulation layer 22. The outer side surfaces of the insulation layer 40 correspond to the outer side surfaces of the wiring substrate 10.

The insulation layer 40 has higher mechanical strength (rigidity, hardness, or the like) than the insulation layers 22, 24, 26, and 28 of the stack 20. The material of the insulation layer 40 may be an insulative resin having higher mechanical strength (rigidity, hardness, or the like) than the photosensitive resin forming the insulation layers 22, 24, 26, and 28. The material of the insulation layer 40 may be, for example, a non-photosensitive, insulative resin of which the main component is a thermosetting resin. The material of the insulation layer 40 may be, for example, a thermosetting resin, such as an epoxy resin or a polyimide resin, or a resin material obtained by mixing a filler such as silica or alumina with such a thermosetting resin. The insulation layer 40 may be formed from, for example, a mold resin. The material of the insulation layer 40 may be, for example, an insulative resin in which reinforcement material is added to a thermosetting resin. The material of the insulation layer 40 may be, for example, a glass epoxy resin formed by impregnating a glass cloth, which is reinforcement material, with a thermosetting insulative resin, of which the main component is epoxy resin. The reinforcement material is not limited to the glass cloth and may be, for example, a glass non-woven cloth, an aramid cloth, an aramid non-woven cloth, a liquid crystal polymer (LCP) cloth, or an LCP non-woven cloth. The thermosetting insulative resin is not limited to epoxy resin and may be, for example, an insulative resin such as a polyimide resin or a cyanate resin.

Figure 2:
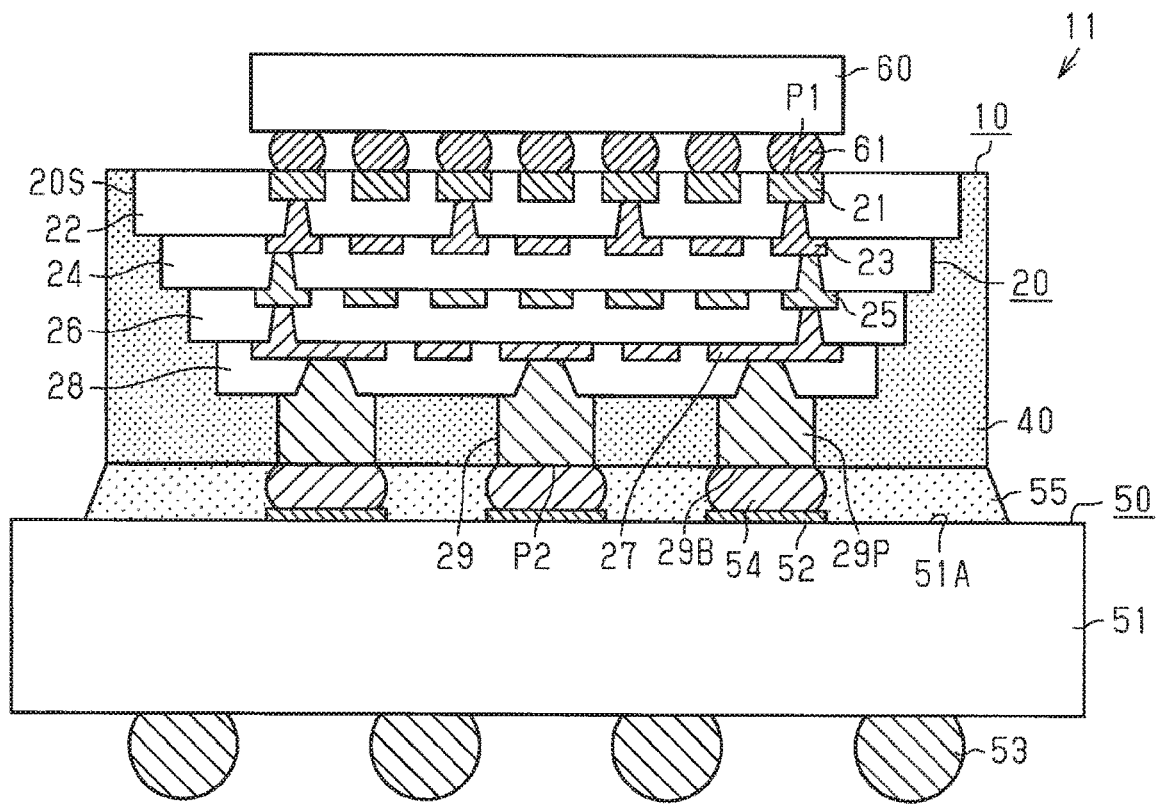
FIG. 2 is a schematic cross-sectional view of a semiconductor device including the wiring substrate of FIG. 1.

The structure of a semiconductor device 11 will now be described with reference to FIG. 2.

The semiconductor device 11 includes the wiring substrate 50, the wiring substrate 10, which functions as an intermediate substrate (interposer), and the semiconductor chip 60.

The wiring substrate 50 includes a substrate body 51, connection pads 52, and external connection terminals 53. The substrate body 51 only needs to have a structure electrically connecting the connection pads 52 and the external connection terminals 53 through the inside of the substrate. Thus, wiring layers can be formed inside the substrate body 51 but does not necessarily have to be formed inside the substrate body. When wiring layers are formed inside the substrate body 51, for example, interlayer insulation layers are formed between the wiring layers, and vias formed in the wiring layers and the interlayer insulation layers electrically connect the connection pads 52 and the external connection terminals 53. The substrate body 51 may be, for example, a cored buildup substrate that includes a core substrate or a coreless substrate that is less a core substrate. When wiring layers are formed inside the substrate body 51, for example, through electrodes extending through the substrate body 51 in the thickness-wise direction electrically connect the connection pads 52 and the external connection terminals 53.

The connection pads 52 are formed on the upper surface of the substrate body 51. The connection pads 52 are laid out in correspondence with the connection pads P2 formed on the wiring substrate 10. The connection pads 52 are arranged, for example, opposing the corresponding connection pads P2. The material of the connection pads 52 may be, for example, copper or a copper alloy.

The external connection terminals 53 are formed on the lower surface of the substrate body 51. The external connection terminals 53 are electrically connected to pads of a mounting substrate (not illustrated) such as a motherboard. The external connection terminals 53 may be solder bumps or lead pins. In the present example, the external connection terminals 53 are solder bumps. The material of the external connection terminals 53 may be, for example, an alloy including lead (Pb), and alloy of tin (Sn) and Cu, an alloy of Sn and silver (Ag), an alloy of Sn, Ag, and Cu, or the like.

The wiring substrate 10 is mounted on the upper surface of the wiring substrate 50. Bumps 54 electrically connecting the wiring substrate 10 and the wiring substrate 50 are formed on the connection pads P2 of the wiring substrate 10. The bumps 54 are bonded with the connection pads P2 of the wiring substrate 10 and the connection pads 52 of the wiring substrate 50. The bumps 54 may be, for example, metal bumps or solder bumps. The material of the solder bumps may be, for example, an alloy including Pb, an alloy of Sn and Au, an alloy or Sn and Cu, an alloy of Sn and Ag, an alloy or Sn, Ag, and Cu, or the like.

A gap between the wiring substrate 50 and the wiring substrate 10 is filled with an underfill resin 55. The material of the underfill resin 55 may be, for example, an insulative resin such as an epoxy resin.

The semiconductor chip 60 is mounted on the upper surface of the wiring substrate 10. The semiconductor chip 60 is, for example, flip-chip-mounted on the wiring substrate 10. In the example of FIG. 2, bumps 61 laid out on a circuit formation surface (in this case, lower surface) of the semiconductor chip 60 are bonded with the connection pads P1 of the wiring substrate 10. The bumps 61 electrically connect the semiconductor chip 60 to the wiring layer 21.

The semiconductor chip 60 may be, for example, a logic chip such as a central processing unit (CPU) chip or a graphics processing unit (GPU) chip/ Further, the semiconductor chip 60 may be, for example, a memory chip such as a dynamic random access memory (DRAM) chip, a static random access memory (SRAM) chip, or a flash memory. The bumps 61 may be gold bumps or solder bumps like the bumps 54.

A method for manufacturing the wiring substrate 10 will now be described with reference to FIGS. 3A to 7A. A batch manufacturing process will now be described in which a batch of wiring substrates 10 are formed and then singulated into individual wiring substrates 10. To facilitate description, same reference numbers are given to the elements of the wiring substrate 10 obtained during the manufacturing process that are the same as the corresponding elements in the final product of the wiring substrate 10.

Figure 3A:
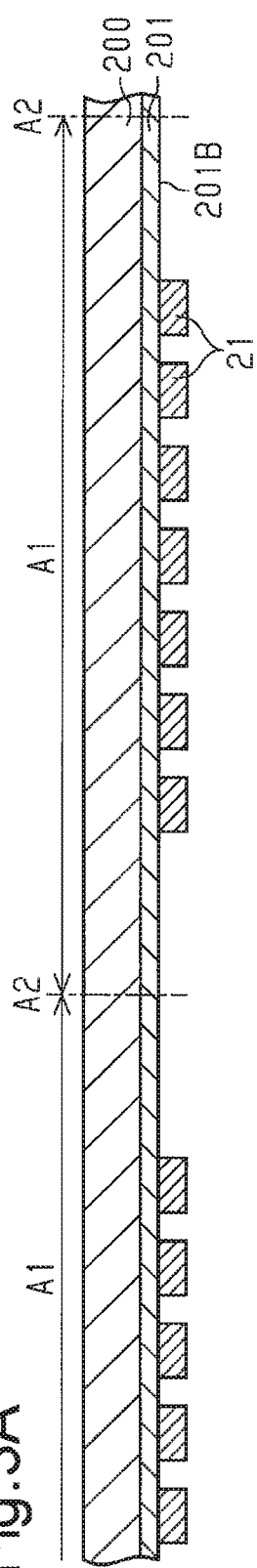

With reference to FIG. 3A, a support substrate 200 is prepared. The support substrate 200 is a large substrate including a plurality of singulation regions A1. A wiring substrate 10 is formed in each singulation region A1. Consequently, the singulation regions A1 are cut out along cutting lines A2 and singulated into individual singulation regions A1 so that a wiring substrate 10 is obtained from each singulation region A1. The material of the support substrate 200 may be a highly rigid plate of, for example, silicon, glass, or metal (e.g., copper). The support substrate 200 may be, for example, a metal plate or metal foil. The support substrate 200 of the present example is a copper foil obtained by applying an extremely thin copper foil of 2 to 5 µm to a support body copper foil of approximately 35 to 70 µm with a delamination layer located in between. The support substrate 200 may have a thickness of, for example, approximately 3 to 100 µm.

A metal film 201 is formed on the lower surface of the support substrate 200 entirely covering the lower surface of the support substrate 200. For example, the metal film 201 is formed on the lower surface of the extremely thin copper foil of the support substrate 200. The metal film 201 may be formed through, for example, a sputtering process, a vapor deposition process, or an electrolytic plating process. The material of the metal film 201 may be a conductive material that serves as a stopper layer when etching and removing the support substrate 200. Further, the material of the metal film 201 may be a conductive material that can be selectively etched and removed from the wiring layer 21 (e.g., Cu layer), which is formed in a subsequent process. The material of the metal film 201 may be, for example, a metal such as nickel (Ni), titanium (Ti), chrome (Cr), tin (Sn), cobalt (Co), iron (Fe), or palladium (Pd), or an alloy including at least one selected from these metals. The material of the metal film 201 in the present example is Ni. The metal film 201 may have a thickness of, for example, approximately 0.1 to 1.0 µm. In the present example, the support substrate 200 and the metal film 201 formed on the support substrate 200 function as a first support substrate.

The wiring layer 21 is formed on a lower surface 201B of the metal film 201. The wiring layer 21 may be formed through, for example, a semi-additive process. In the present example, a resist pattern (not illustrated) including openings in conformance with the shape of the lower surface 201B of the wiring layer 21 is formed on the metal film 201. Then, electrolytic copper plating is performed using the support substrate 200 and the metal film 201 as a power supplying layer to deposit a copper plating film on the lower surface 201B of the metal film 201 exposed from the openings of the resist pattern. Afterwards, the resist pattern is removed to form the wiring layer 21 on the metal film 201. In addition to the semi-additive process, any of various types of wiring formation processes such as a subtractive process may be employed to form the wiring layer 21.

Figure 3B:
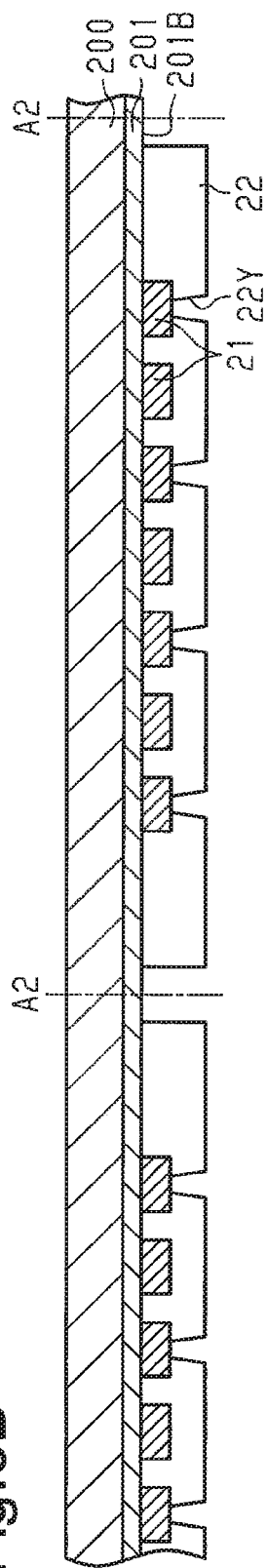

In the step illustrated in FIG. 3B, the insulation layer 22 including the through holes 22Y partially exposing the lower surface of the wiring layer 21 is formed on the lower surface 201B of the metal film 201. For example, when using a resin film as the insulation layer 22, thermal compression bonding is performed to laminate a resin film on the lower surface 201B of the metal film 201, and a photolithography process is performed to pattern the resin film and form the insulation layer 22. Further, a spin coating process is performed to apply a liquid or paste of an insulative resin on the lower surface 201B of the metal film 201, and a photolithography process is performed pattern the insulative resin and form the insulation layer 22.

Figure 3C:
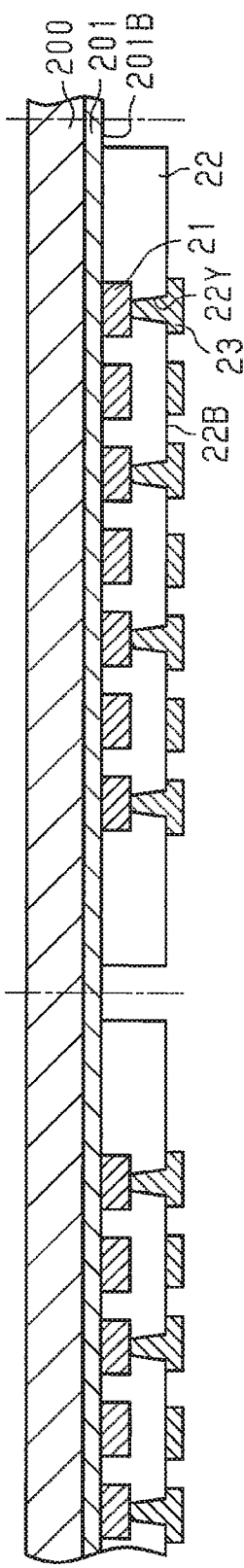

In the step illustrated in FIG. 3C, for example, a semi-additive process is performed to fill the through holes 22Y with via wirings and form the wiring layer 23. The wiring layer 23 includes a wiring pattern formed on the lower surface 22B of the insulation layer 22 and electrically connected by the via wiring to the wiring layer 21.

In the step illustrated in FIG. 4A, the insulation layer 24, which includes the through holes 24X partially exposing the lower surface of the wiring layer 23, is formed on the lower surface 22B of the insulation layer 22 in the same manner as the step illustrated in FIG. 3B. The insulation layer 24 is slightly smaller than the insulation layer 22 and exposes the peripheral portion of the lower surface 22B of the insulation layer 22.

In the step illustrated in FIG. 4B, for example, a semi-additive process is performed to fill the through holes 24X with via wirings and form the wiring layer 25. The wiring layer 25 includes a wiring pattern formed on the lower surface 24B of the insulation layer 24 and electrically connected by the via wiring to the wiring layer 23.

In the step illustrated in FIG. 5A, the insulation layer 26 including the through holes 26X partially exposing the lower surface of the wiring layer 25 is formed on the lower surface 24B of the insulation layer 24 in the same manner as the step illustrated in FIG. 3B. The insulation layer 26 is slightly smaller than the insulation layer 24 and exposes the peripheral portion of the lower surface 24B of the insulation layer 24. Then, for example, a semi-additive process is performed to fill the through holes 26X with via wirings and form the wiring layer 27. The wiring layer 27 includes a wiring pattern formed on the lower surface 26B of the insulation layer 26 and electrically connected by the via wiring to the wiring layer 25. Afterwards, the insulation layer 28 including the through holes 28X partially exposing the lower surface of the wiring layer 27 is formed on the lower surface 26B of the insulation layer 26 in the same manner as the step illustrated in FIG. 3B. The insulation layer 28 is slightly smaller than the insulation layer 26 and exposes the peripheral portion of the lower surface 26B of the insulation layer 26. Then, for example, a semi-additive process is performed to form the wiring layer 29 including the via wirings 29V and the connection terminals 29P. The through holes 28X are filled with the via wirings 29V. The connection terminals 29P are electrically connected by the via wirings 29V to the wiring layer 27 and formed on the lower surface 28B of the insulation layer 28.

Through the manufacturing steps described above, the stack 20 is formed on the lower surface 201B of the metal film 201 in each singulation region A1. Further, steps are formed in the side surfaces 20S of the stack 20.

In the step illustrated in FIG. 5B, the insulation layer 40 encapsulating the stack 20 is formed on the lower surface 201B of the metal film 201. The insulation layer 40 entirely covers the side surfaces 20S of the stack 20. Further, the insulation layer 40 entirely covers the lower surface of the stack 20, in the present example, the lower surface 28B of the insulation layer 28, the side surfaces of the connection terminals 29P, and the lower surface 29B of the connection terminals 29P. Further, the insulation layer 40 entirely covers the lower surface 201B of the metal film 201. The space between the stack 20 and an adjacent stack 20 is filled with the insulation layer 40. In this manner, the insulation layer 40 is also formed on the lower surface 201B of the metal film 201 at locations that correspond to the cutting lines A2 and are consequently cut. Only the insulation layer 40 is formed on the lower surface 201B of the metal film 201 at locations corresponding to the cutting lines A2.

When using, for example, a thermosetting mold resin as the material of the insulation layer 40, the structure illustrated in FIG. 5A is arranged in a mold. Then, pressure (e.g., 5 to 10 MPa) is applied to the mold to charge the mold with a fluidized mold resin. The mold resin is heated to approximately 180° and then hardened to form the insulation layer 40. The mold may be charged with mold resin by performing a transfer molding process, a compression molding process, an inkjet molding process, or the like.

When using, for example, a thermosetting resin film as the insulation layer 40, the resin film is laminated on the stack 20 and the lower surface 201B of the metal film 201 to cover the stack 20 and the entire lower surface 201B of the metal film 201. Then, the resin film is pressed and hardened by undergoing a heat treatment at a temperature higher than or equal to the hardening temperature (e.g., approximately 130° C. to 200° C.) to form the insulation layer 40. The resin film may be, for example, a thermosetting resin of which the main component is an epoxy resin. When using a liquid or paste of insulative resin as the insulation layer 40, a spin coating process is performed to apply the liquid or paste of insulative resin to the stack 20 and the entire lower surface 201B of the metal film 201. The applied insulative resin is hardened by undergoing a heat treatment at a temperature greater than or equal to the hardening temperature to form the insulation layer 40. The liquid or paste of insulative resin may be a thermosetting resin of which the main component is an epoxy resin.

In the step illustrated in FIG. 6A, the insulation layer 40 is thinned from the lower surface 40B to expose the lower surface 29B of each connection terminal 29P from the insulation layer 40. For example, backgrinding or the like is performed to grind the lower surface 40B of the insulation layer 40 and reduce the thickness of the insulation layer 40. In the present step, for example, the insulation layer 40 is thinned so that the lower surface 40B of the insulation layer 40 becomes flush with the lower surface 29B of each connection terminal 29P. In the present step, the lower surface 29B of each connection terminal 29P may be thinned together with the insulation layer 40. When necessary, a surface-processed layer may be formed on the surface (lower surface 29B) of each connection terminal 29P exposed from the insulation layer 40.

Through the manufacturing steps described above, the wiring substrate 10 is formed on the lower surface 201B of the metal film 201 in each singulation region A1.

Then, the support substrate 200 is removed. For example, the support body copper foil of the support substrate 200 is mechanically delaminated from the extremely thin copper foil. In this case, the delamination layer is located between the support body copper foil and the extremely thin copper foil, and the adhesive force is weak between the support body copper foil and the extremely thin copper film. Thus, the support body copper foil can easily be delaminated from the extremely thin copper foil. Afterwards, wet etching is performed using, for example, aqueous ferric chloride, aqueous copper chloride, aqueous ammonium persulfate, or the like to remove the residual extremely thin copper foil from the metal film 201. The metal film 201 functions as a stopper layer when etching the extremely thin copper foil of the support substrate 200.

Etching is performed to remove the metal film 201. When using, for example, Ni as the material of the metal film 201, wet etching is performed using a hydrogen peroxide or nitric acid solution to selectively etch the wiring layer 21 (Cu layer) and remove the metal film 201. The wiring layer 21 and the insulation layers 22 and 40 function as a stopper layer when the metal film 201 is etched. In the present example, as illustrated in FIG. 6B, the upper surface 21A of the wiring layer 21, the upper surface 22A of the insulation layer 22, and the upper surface 40A of the insulation layer 40 are exposed to the outside. The upper surface 21A of the wiring layer 21, the upper surface 22A of the insulation layer 22, and the upper surface 40A of the insulation layer 40, which were in contact with the lower surface 201B of the metal film 201 (refer to FIG. 6A), are shaped in conformance with the lower surface 201B (flat surface) of the metal film 201. Thus, the upper surface 21A of the wiring layer 21, the upper surface 22A of the insulation layer 22, and the upper surface 40A of the insulation layer 40 are substantially flush with one another.

The side surfaces 20S and the lower surface of the stack 20 are covered by the insulation layer 40 having a higher mechanical strength than the insulation layers 22, 24, 26, and 28 in the stack 20. The insulation layer 40 increases the rigidity of the structure illustrated in FIG. 6B as compared with a structure including only the stack 20. Thus, even after the support substrate 200 is removed, the occurrence of warping is limited with the structure of FIG. 6B.

The structure illustrated in FIG. 6B is cut by a dicing blade or the like along the cutting lines A2. In the present example, the insulation layer 40 is cut along the cutting lines A2. This singulates the wiring substrates 10 of the present embodiment as illustrated in FIG. 7A. In the structure of FIG. 6B, the side surfaces 20S of the stack 20 are entirely covered by the insulation layer 40. Thus, only the insulation layer 40 is cut by the dicing blade or the like, and only the outer side surfaces of the insulation layer 40 are exposed from the cut surface of the wiring substrate 10. In other words, in the present step (dicing step), the insulation layers 22, 24, 26, and 28 in the stack 20 are not cut. This obviates delamination that occurs in the insulation layers 22, 24, 26, and 28, which are formed from a photosensitive resin.

The singulated wiring substrate 10 may be used upside down or arranged at any angle.

A method for manufacturing the semiconductor device 11 will now be described.

In the step illustrated in FIG. 7B, the bumps 54 (solder bumps) are first formed on the connection pads P2 of the wiring substrate 10. For example, after applying flux to the connection pads P2 and mounting solder balls on the connection pads P2, a reflow process is performed at a temperature of approximately 240° C. to 260° C. to fix the solder balls to the connection pads P2. Then, the surfaces of the solder balls and the connection pads P2 are cleaned to remove the flux.

The wiring substrate 50, which includes the substrate body 51 and the connection pads 52 formed on an upper surface 51A of the substrate body 51, is prepared. The wiring substrate 50 can be manufactured through a known manufacturing process. Thus, the manufacturing process will not be described.

The wiring substrate 10 is mounted on the wiring substrate 50. In the present example, the bumps 54 formed on the connection pads P2 are bonded with the connection pads 52 of the wiring substrate 50. For example, when the bumps 54 are solder bumps, the connection pads P2 are aligned with the connection pads 52. Then, a reflow process is performed to melt the bumps 54 (solder bumps) and electrically connect the connection pads P2 to the connection pads 52.

The underfill resin 55 is formed between the upper surface 51A of the wiring substrate 50 and the lower surface of the wiring substrate 10. Then, the semiconductor chip 60 is flip-chip-mounted on the wiring substrate 10, and the external connection terminals 53 are formed on the lower surface of the substrate body 51 of the wiring substrate 50.

The semiconductor device 11 of the present embodiment may be formed through the manufacturing steps described above. After flip-chip-mounting the semiconductor chip 60 on the wiring substrate 10, the wiring substrate 10 can be mounted on the wiring substrate 50. The external connection terminals 53 can be formed before mounting the wiring substrate 10 on the wiring substrate 50.

The advantages of the first embodiment will now be described.

(1) The insulation layer 40, which has higher rigidity than the insulation layers 22, 24, 26, and 28 in the stack 20, covers the lower surface of the stack 20 and entirely covers the side surfaces 20S. This increases the rigidity of the wiring substrate 10 as compared with a structure including only the stack 20. Thus, even after the support substrate 200 is removed in the manufacturing process, warping and bending of the wiring substrate 10 are limited. This facilitates handling of the wiring substrate 10 during the manufacturing process.

(2) A thin film formed from a photosensitive resin is brittle. Thus, if thin films are formed on the cutting line, stress produced during dicing may cause delamination of the thin films.

In this regard, the insulation layer 40 entirely covers the side surfaces 20S of the stack 20 in the first embodiment. Thus, the outer side surfaces of the wiring substrate 10 are not formed by the side surfaces 20S of the stack 20, and the insulation layers 22, 24, 26, and 28 in the stack 20 are not arranged at where the cutting lines A2 are located. Thus, the insulation layers 22, 24, 26, and 28 in the stack 20 are not cut during dicing. This obviates the occurrence of delamination in the insulation layers 22, 24, 26, and 28 during dicing.

(3) The insulation layer 40 covers the lower surface of the stack 20 and entirely covers the side surfaces 20S. In comparison with, for example, a case in which the insulation layer 40 covers only the lower surface of the stack 20, the contact area of the stack 20 with the insulation layer 40 is increased. This improves the adhesion between the stack 20 and the insulation layer 40.

(4) The side surfaces 20S of the stack 20 are stepped. The insulation layer 40 entirely covers the stepped surfaces of the insulation layers 22, 24, 26, and 28. This increases the contact area of the insulation layer 40 and the stack 20 (in particular, the insulation layers 22, 24, 26, and 28) and improves the adhesion of the stack 20 and the insulation layer 40.

(5) The lowermost wiring layer 29 (connection terminals 29P) is thicker than the other wiring layers 21, 23, 25, and 27. This improves the connection reliability of the bumps 54, when, for example, the bumps 54 (solder bumps) are formed on the lower surface 29B of the wiring layer 29.

(6) The insulation layer 40 is in contact with the post-shaped connection terminals 29P and surrounds the connection terminals 29P. This enlarges the interface of the connection terminals 29P with the insulation layers 28 and 40 and disperses stress produced at the interface of the connection terminals 29P with the insulation layer 28 and 40. Thus, the formation of cracks is limited in the interface of the connection terminals 29P with the insulation layer 28 and 40.

Second Embodiment

A second embodiment will now be described with reference to FIGS. 8 to 18. Same reference numerals are given to those components that are the same as the corresponding components illustrated in FIGS. 1 to 7B. Such components will not be described in detail.

The structure of a wiring substrate 12 will now be described with reference to FIG. 8.

The wiring substrate 12 includes the wiring substrate 10 and a wiring substrate 70, in which the wiring substrate 10 is embedded (incorporated). The wiring substrate 70 is a low-density wiring layer including wiring layers in a lower wiring density than, for example, the wiring substrate 10 (stack 20).

The wiring substrate 10 includes the stack 20 and the insulation layer 40. The insulation layer 40 covers the lower surface of the stack 20 and entirely covers the side surfaces 20S of the stack 20. The wiring layer 21, the insulation layer 22, the wiring layer 23, the insulation layer 24, the wiring layer 25, the insulation layer 26, the wiring layer 27, the insulation layer 28, and the wiring layer 29 are sequentially stacked in the stack 20.

In the wiring substrate 10, the upper surface 21A of the uppermost wiring layer 21 is exposed as the connection pads P1 from the insulation layers 22 and 40. The upper surface 21A of the wiring layer 21, the upper surface 22A of the insulation layer 22, and the upper surface 40A of the insulation layer 40 are substantially flush with one another. The lower surface 29B of the lowermost wiring layer 29 is substantially flush with the lower surface 40B of the insulation layer 40. In the wiring substrate 10, the side surfaces 20S of the stack 20 are stepped, and the insulation layer 40 entirely covers the stepped side surfaces 20S of the stack 20.

The wiring substrate 70 includes an insulation layer 71, a wiring layer 72, a wiring structure 80 formed on a lower surface 71B of the insulation layer 71, and a solder resist layer 85 formed on the lower surface of the wiring structure 80. The wiring structure 80 sequentially stacks an insulation layer 81, which is formed on the lower surface 71B of the insulation layer 71, a wiring layer 82, an insulation layer 83, and a wiring layer 84.

The material of the insulation layers 71, 81, and 83 may be a non-photosensitive resin of which the main component is a thermosetting resin. The material of the insulation layers 71, 81, and 83 may be, for example, a thermosetting resin, such as an epoxy resin or a polyimide resin, or a resin material obtained by mixing a filler such as silica or alumina with such a thermosetting resin. The material of the insulation layers 71, 81, and 83 may be, for example, an insulative resin in which reinforcement material is added to a thermosetting resin. The material of the insulation layer 71 may be, for example, the same type of resin material as the resin material forming the insulation layer 40 or a resin material of a type differing from that of the resin material forming the insulation layer 40. Preferably, the material of the insulation layer 71 is, for example, the same type of resin material as the resin material forming the insulation layer 40. The material of wiring layers 72, 82, and 84 may be, for example, copper or a copper alloy.

The insulation layers 71, 81, and 83 are thicker than the insulation layers 22, 24, 26, and 28 in the stack 20. The insulation layers 71, 81, and 83 each have a thickness of, for example, approximately 30 to 70 µm. The wiring layers 72, 82, and 84 are thicker than the wiring layers 21, 23, 25, 27, and 29 in the stack 20. The wiring layers 72, 82, and 84, which are respectively formed on the lower surfaces of the insulation layers 71, 81, and 83, each have a thickness of, for example, approximately 15 to 35 µm. The wiring layers 72, 82, and 84 have larger wiring widths and wiring intervals than the wiring layers 21, 23, 25, 27, and 29 in the stack 20. The line-and-space (L/S) of each of the wiring layers 72, 82, and 84 is, for example, approximately 20 µm/20 µm.

The insulation layer 71 covers the lower surface of the wiring substrate 10 and entirely covers the side surfaces of the wiring substrate 10. The insulation layer 71 exposes the upper surface of the wiring substrate 10. The insulation layer 71 entirely covers the outer side surfaces of the insulation layer 40 that form the side surfaces of the wiring substrate 10. The insulation layer 71 covers the lower surface 40B of the insulation layer 40 and the lower surface 29B of the wiring layer 29 that form the lower surface of the wiring substrate 10. The upper surface of the wiring substrate 10 is entirely exposed from the insulation layer 71. In other words, an upper surface 71A of the insulation layer 71 includes a recess 71X, which is recessed toward the lower surface 71B of the insulation layer 71, at a given location. The recess 71X is deep enough to extend from the upper surface 71A of the insulation layer 71 to an intermediate position in the thickness-wise direction of the insulation layer 71. The wiring substrate 10 is embedded in the recess 71X.

For example, the inner side surfaces of the recess 71X entirely contact the outer side surfaces of the insulation layer 40 so that there are no gaps extending from the side surfaces of the recess 71 to the side surfaces of the insulation layer 40. The recess 71X has an inner bottom surface that contacts the lower surface 40B of the insulation layer 40 and the lower surface 29B of the wiring layer 29 so that there are no gaps from the inner bottom surface of the recess 71X to the lower surfaces 40B and 29B.

The upper surface 71A of the insulation layer 71 is flush with the upper surface of the wiring substrate 10. In the present example, the upper surface 71A of the insulation layer 71 is flush with the upper surface 21A of the wiring layer 21, the upper surface 22A of the insulation layer 22, and the upper surface 40A of the insulation layer 40.

The insulation layer 71 includes through holes 71Y that open at given locations in the lower surface 71B. The through holes 71Y extend through the insulation layer 71 in the thickness-wise direction and partially expose the lower surface 29B of the wiring layer 29 in the wiring substrate 10. The through holes 71Y are each tapered so that the diameter decreases from the lower surface 71B of the insulation layer 71 (lower side in FIG. 8) toward the upper surface 71A of the insulation layer 71 (upper side in FIG. 8). For example, the through holes 71Y each have the form of a substantially truncated conical hole of which the upper open end has a smaller diameter than the lower open end.

The wiring layer 72 is formed on the lower surface 71B of the insulation layer 71. The wiring layer 72 is electrically connected to the wiring layer 29 of the wiring substrate 10. The wiring layer 72 includes, for example, via wirings 72V and wiring patterns 72P. The through holes 71Y are filled with the via wirings 72V, and the wiring patterns 72P are formed on the lower surface 71B of the insulation layer 71. For example, the via wirings 72V are formed integrally with the wiring patterns 72P.

The structure of the wiring structure 80 will now be described.

The insulation layer 81 is formed on the lower surface 71B of the insulation layer 71 covering the wiring layer 72. The insulation layer 81 includes through holes 81X at given locations. The through holes 81X extend through the insulation layer 81 in the thickness-wise direction and partially expose the lower surface of the wiring layer 72.

The wiring layer 82 is electrically connected to the wiring layer 72. The wiring layer 82 includes via wirings and wiring patterns. The through holes 81X are filled with the via wirings. The wiring patterns are formed integrally with the via wirings and laid out on the lower surface of the insulation layer 81.

The insulation layer 83 is formed on the lower surface of the insulation layer 81 covering the wiring layer 82. The insulation layer 83 includes through holes 83X at given locations. The through holes 83X extend through the insulation layer 83 in the thickness-wise direction and partially expose the lower surface of the wiring layer 82.

Figure 8:
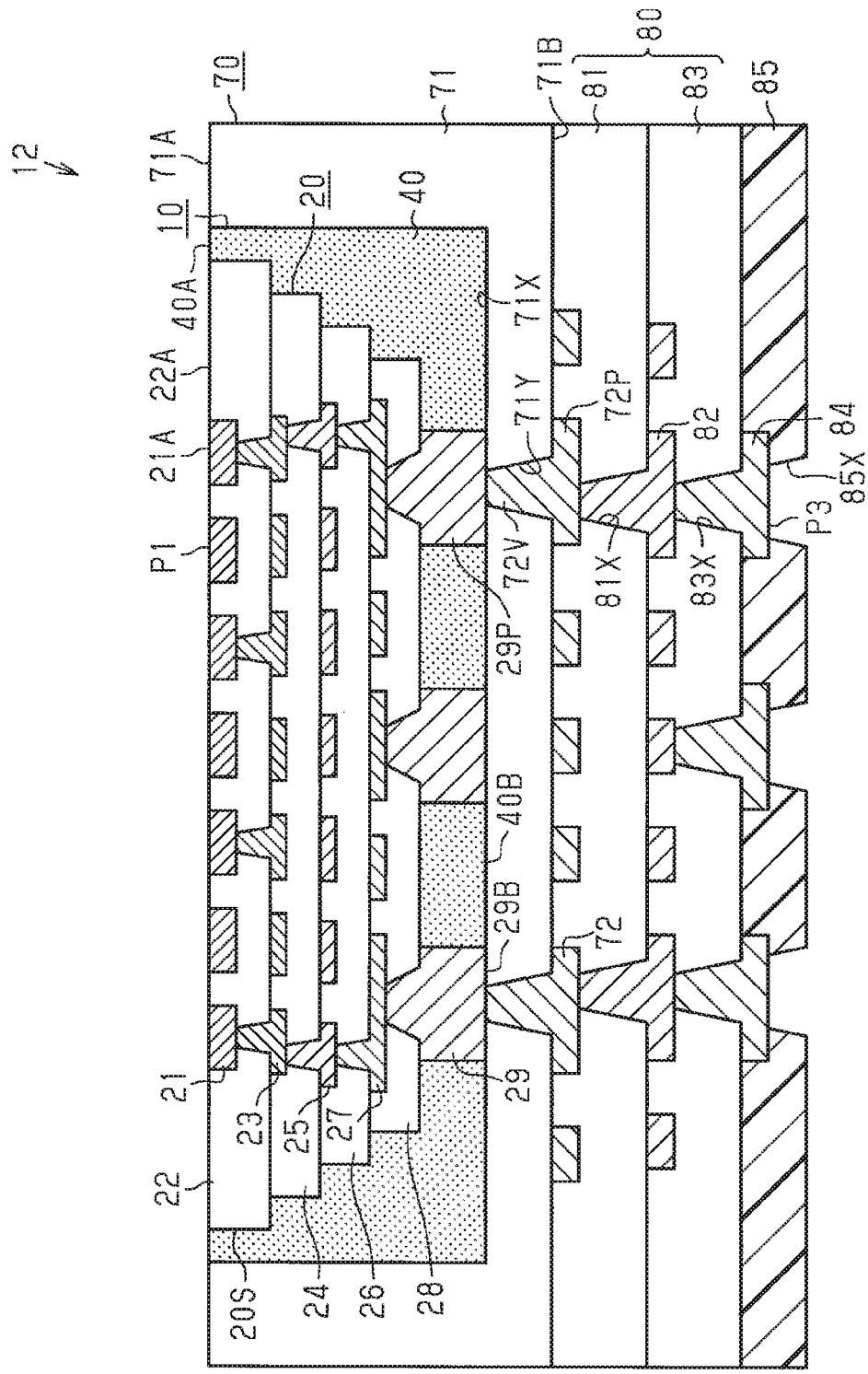
FIG. 8 is a schematic cross-sectional view of a wiring substrate in accordance with a second embodiment.

The through holes 81X and 83X are, for example, each tapered so that the diameter decreases from the lower side (side of wiring layer 84) toward the upper side (side of wiring layer 72) as viewed in FIG. 8. For example, the through holes 81X and 83X each have the form of a substantially truncated conical hole of which the upper open end has a smaller diameter than the lower open end.

The wiring layer 84 is electrically connected to the wiring layer. The wiring layer 84 includes via wirings and wiring patterns. The through holes 83X are filled with the via wirings. The wiring patterns are formed integrally with the via wirings and laid out on the lower surface of the insulation layer 83.

The solder resist layer 85 is an outermost (lowermost) protective insulation layer formed on the lower surface of the wiring structure 80. The solder resist layer 85 is formed on the lower surface of the insulation layer 83 covering the wiring layer 84. The solder resist layer 85 includes openings 85X at given locations. The openings 85X extend through the solder resist layer 85 in the thickness-wise direction and partially expose the lower surface of the wiring layer 84 as external connection pads P3. The external connection pads P3 may be connected to external connection terminals 86 (refer to FIG. 9), such as solder bumps and lead pins, to mount the wiring substrate 12 on a mounting substrate such as a motherboard. When necessary, a surface-processed layer may be formed on the wiring layer 84 exposed from the openings 85X. Examples of the surface-processed layer include an Au layer, a Ni/Au layer, a Ni/Pd/Au layer, and an OSP film. Further, the wiring layer 84 exposed from the openings 85X or the surface-processed layer formed on the wiring layer 84 may be used as external connection terminals.

The openings 85X and the external connection pads P3 may have any planar shape or size. For example, the openings 85X and the external connection pads P3 may be circular and have a diameter of approximately 200 to 1000 μm. The material of the solder resist layer 85 may be, for example, a photosensitive insulative resin of which the main component is a phenol resin or a polyimide resin. The solder resist layer 85 may include, for example, a filler such as silica or alumina.

Figure 9:
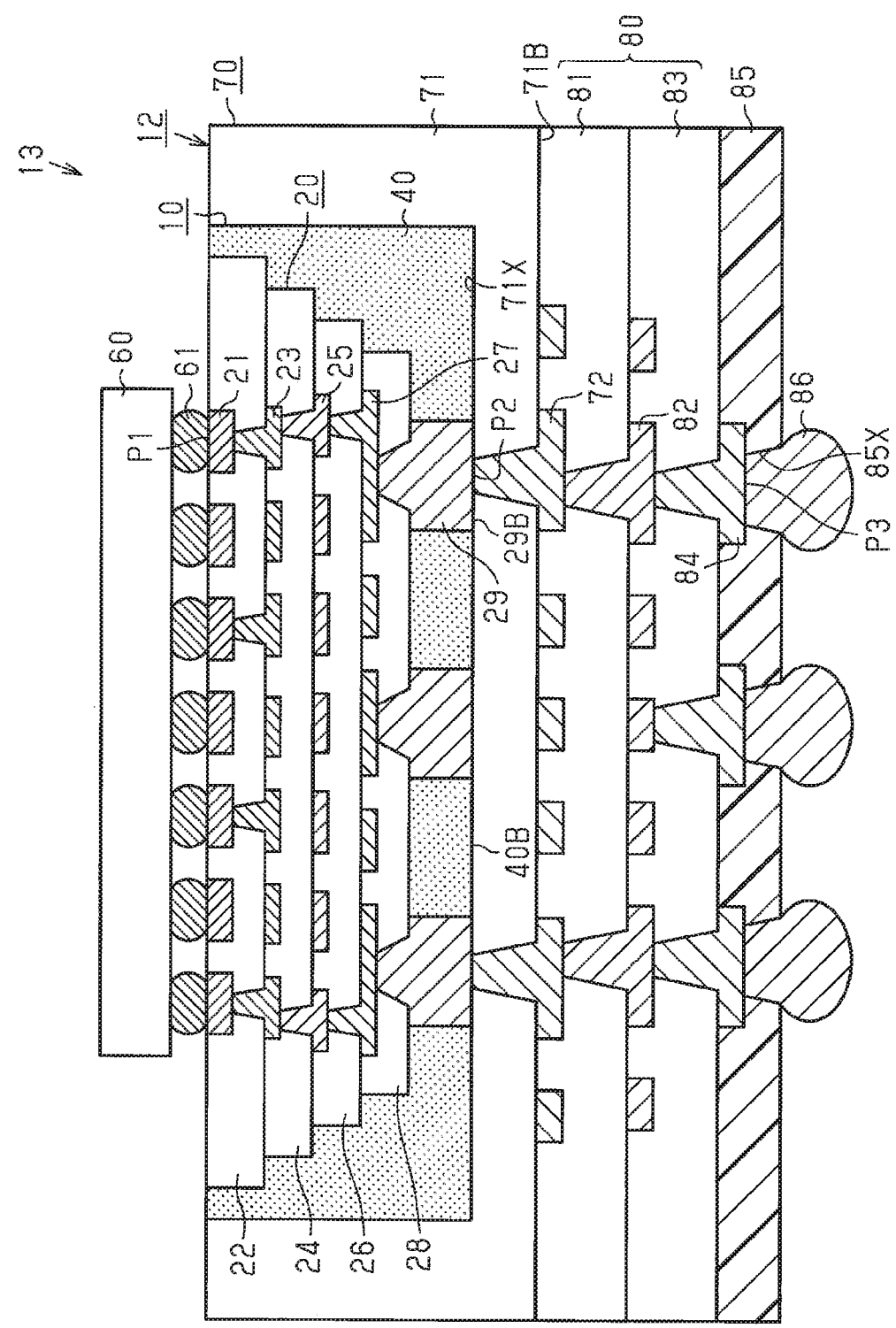
FIG. 9 is a schematic cross-sectional view of a semiconductor device including the wiring substrate of FIG. 8.

The structure of a semiconductor device 13 will now be described with reference to FIG. 9.

The semiconductor device 13 includes the wiring substrate 12, the semiconductor chip 60, and the external connection terminals 86.

The semiconductor chip 60 is mounted on the upper surface of the wiring substrate 12. The semiconductor chip 60 is, for example, flip-chip-mounted on the wiring substrate 10, which is incorporated in the wiring substrate 70. In the present example, the bumps 61 on the circuit formation surface (in this case, lower surface) of the semiconductor chip 60 are bonded with the connection pads P1 of the wiring substrate 10. The bumps 61 electrically connect the semiconductor chip 60 to the wiring layer 21.

The wiring substrate 10 incorporated in the wiring substrate 70 function as an intermediate substrate (interposer) connecting the semiconductor chip 60 and the wiring substrate 70. That is, the semiconductor chip 60, which is flip-chip-mounted on the wiring substrate 10, is electrically connected by the wiring substrate 10 to the wiring layers 72, 82, and 84 of the wiring substrate 70.

The external connection terminals 86 are formed on the external connection pads P3 of the wiring substrate 12 (the wiring substrate 70). The external connection terminals 86 are electrically connected to, for example, pads of a mounting substrate such as a motherboard (not illustrated). The external connection terminals 86 may be, for example, solder bumps or lead pins. In the present example, solder bumps are used as the external connection terminals 86.

A method for manufacturing the wiring substrate 12 will now be described with reference to FIGS. 10 to 18. A batch manufacturing process will now be described in which a batch of wiring substrates 12 are formed and then singulated into individual wiring substrates 12. To facilitate description, same reference numbers are given to the elements of the wiring substrate 12 obtained during the manufacturing process that are the same as the corresponding elements in the final product of the wiring substrate 12.

In the step illustrated in FIG. 10A, the large support substrate 200 is prepared including the singulation regions A1. A wiring substrate 10 is formed in each singulation region A1. The support substrate 200 may be, for example, a metal plate or a metal foil. Then, the metal film 201 is formed on the lower surface of the support substrate 200 entirely covering the lower surface of the support substrate 200. The material of the metal film 201 may be, for example, a metal, such as Ni, Ti, Cr, Sn, Co, Fe, or Pd, or an alloy including at least one selected from these metals. Further, the wiring layer 21, the insulation layer 22, the wiring layer 23, the insulation layer 24, the wiring layer 25, the insulation layer 26, the wiring layer 27, the insulation layer 28, and the wiring layer 29 are sequentially stacked on the lower surface 201B of the metal film 201 in each singulation region A1 to form the stack 20.

In the step illustrated in FIG. 10B, the insulation layer 40, which encapsulates the stack 20, is formed on the lower surface 201B of the metal film 201. The insulation layer 40 entirely covers the side surfaces 20S of the stack 20. Further, the insulation layer 40 entirely covers the lower surface of the stack 20, in the present example, the lower surface 28B of the insulation layer 28, the side surfaces of the connection terminals 29P, and the lower surfaces 29B of the connection terminals 29P. The space between stack 20 and an adjacent stack 20 is filled with the insulation layer 40.

Figure 11A:
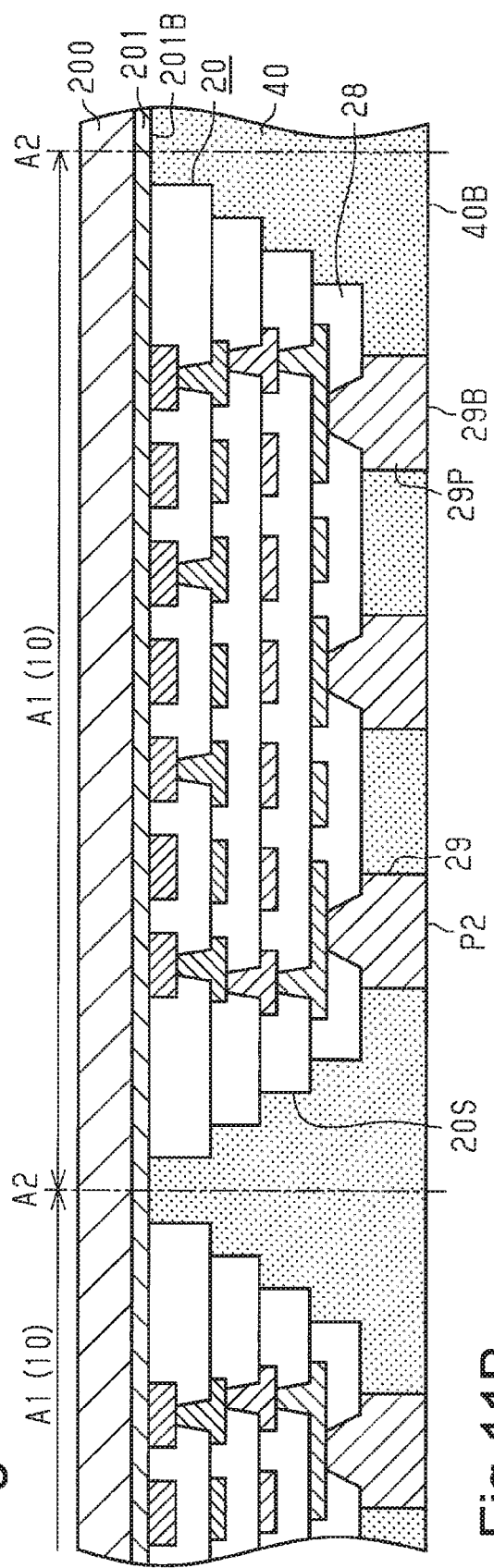

In the step illustrated in FIG. 11A, the insulation layer 40 is thinned from the lower surface 40B to expose the lower surface 29B of each connection terminal 29P from the insulation layer 40.

Figure 11B:
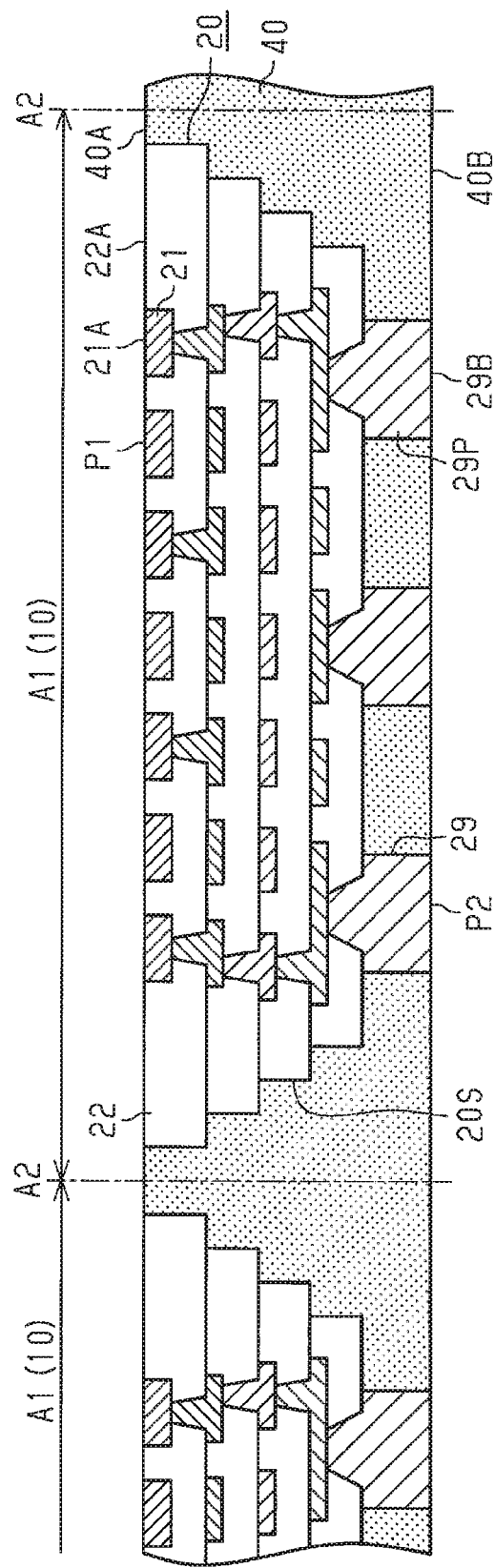

Then, the support substrate 200 is removed, and the metal film 201 is etched and removed. As illustrated in FIG. 11B, the present step exposes the upper surface 21A of the wiring layer 21, the upper surface 22A of the insulation layer 22, and the upper surface 40A of the insulation layer 40 to the outside.

The structure illustrated in FIG. 11B is cut along the cutting lines A2 by a dicing blade or the like. In the present example, the insulation layer 40 is cut along the cutting lines A2. This singulates and forms the individual wiring substrates 10 of the present embodiment as illustrated in FIG. 12A.

In the step illustrated in FIG. 12B, a support substrate 210 separate from the support substrate 200 (refer to FIG. 10A) is prepared. A large substrate including singulation regions A3, in which wiring substrates 12 are formed, is used as the support substrate 210. The support substrate 210 is consequently cut along the cutting lines A4 into the singulation regions A3. A wiring substrate 12 is formed in each singulation region A3. The singulation regions A3 are larger in a plan view than the singulation regions A1 of the support substrate 200 (refer to FIG. 10A).

The support substrate 210 includes, for example, a support body 211 and a delamination layer 212 formed on the lower surface of the support body 211. The material of the support body 211 may be, for example, a highly rigid plate of, for example, silicon, glass, or metal (e.g., copper). The delamination layer 212 may be a UV delamination adhesive, of which the adhesive force decreases by applying light energy with ultraviolet light, or a thermal delamination adhesive, of which the adhesive force decreases by applying thermal energy. Further, the delamination layer 212 may be a laser delamination adhesive, of which the adhesive force decreases by applying energy with laser light. The delamination layer 212 may be formed by applying a sheet of adhesive to the lower surface of the support body 211 or by applying a varnish of adhesive to the lower surface of the support body 211.

The wiring substrates 10 formed in the steps of FIGS. 10A to 12A are mounted on the singulation regions A3 of the support substrate 210 (in FIG. 12B, lower surface 212B of delamination layer 212). The two wiring substrates 10 mounted on adjacent singulation regions A3 are spaced apart from each other.

Figure 13:
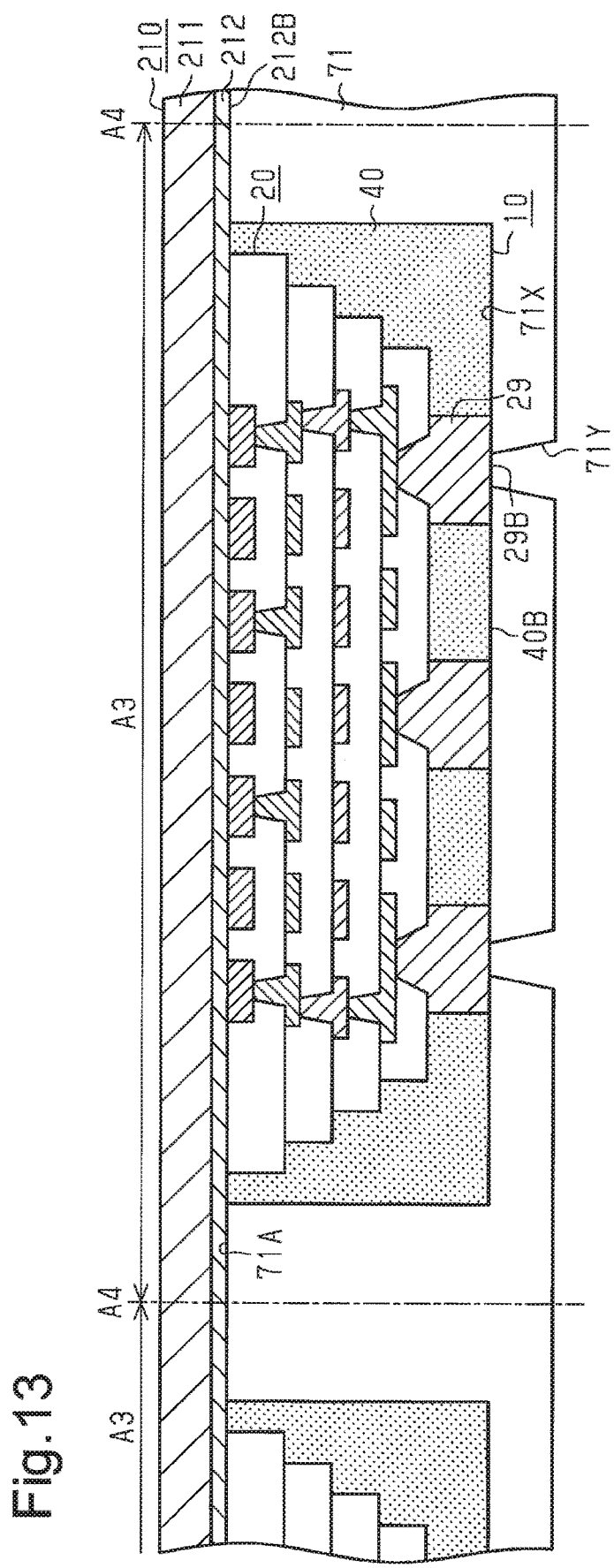

In the step illustrated in FIG. 13, the insulation layer 71 is formed on the support substrate 210 (in FIG. 13, lower surface 212B of delamination layer 212) entirely covering the side surfaces and the lower surface of the wiring substrate 10. The insulation layer 71 entirely covers the lower surface 212B of the delamination layer 212. Further, the space between adjacent wiring substrates 10 are filled with the insulation layer 71. That is, the insulation layer 71 is formed on the lower surface 212B of the delamination layer 212 at the consequently cut out locations along the cutting lines A4.

When using a resin film as the insulation layer 71, the resin film is laminated on the lower surface 212B of the delamination layer 212. The resin film is pressed and hardened by undergoing a heat treatment at a temperature higher than or equal to the hardening temperature (e.g., approximately 130° C. to 200° C.) to form the insulation layer 71. The resin film can be laminated in a vacuum atmosphere to prevent the formation of voids. The resin film may be, for example, a film of a thermosetting resin of which the main component is an epoxy resin. When a liquid or paste of an insulative resin is used as the insulation layer 71, spin coating is performed to apply the liquid or paste of insulative resin to the lower surface 212B of the delamination layer 212. The applied insulative resin is hardened by undergoing a heat treatment at a temperature greater than or equal to the hardening temperature to form the insulation layer 71. The liquid or paste of insulative resin may be, for example, a thermosetting resin of which the main component is an epoxy resin.

In the present step, the recess 71X, which accommodates the wiring substrate 10, is formed in the upper surface 71A of the insulation layer 71. The recess 71X is formed so that the inner side surfaces of the recess 71X contact the side surfaces of the wiring substrate 10 without forming gaps in between and so that the inner bottom surface of the recess 71X contacts the lower surface of the wiring substrate 10 without forming gaps in between.

The through holes 71Y are formed in the insulation layer 71 at given locations to partially expose the lower surface 29B of the wiring layer 29 of the wiring substrate 10. The through holes 71Y are formed, for example, by performing a laser process using a $CO_2$ laser or a UV-YAG laser. When forming the through holes 71Y through a laser process, a desmearing process is performed to remove resin smears from the surface of the wiring layer 29 exposed from the bottom of each through hole 71Y.

Figure 14:
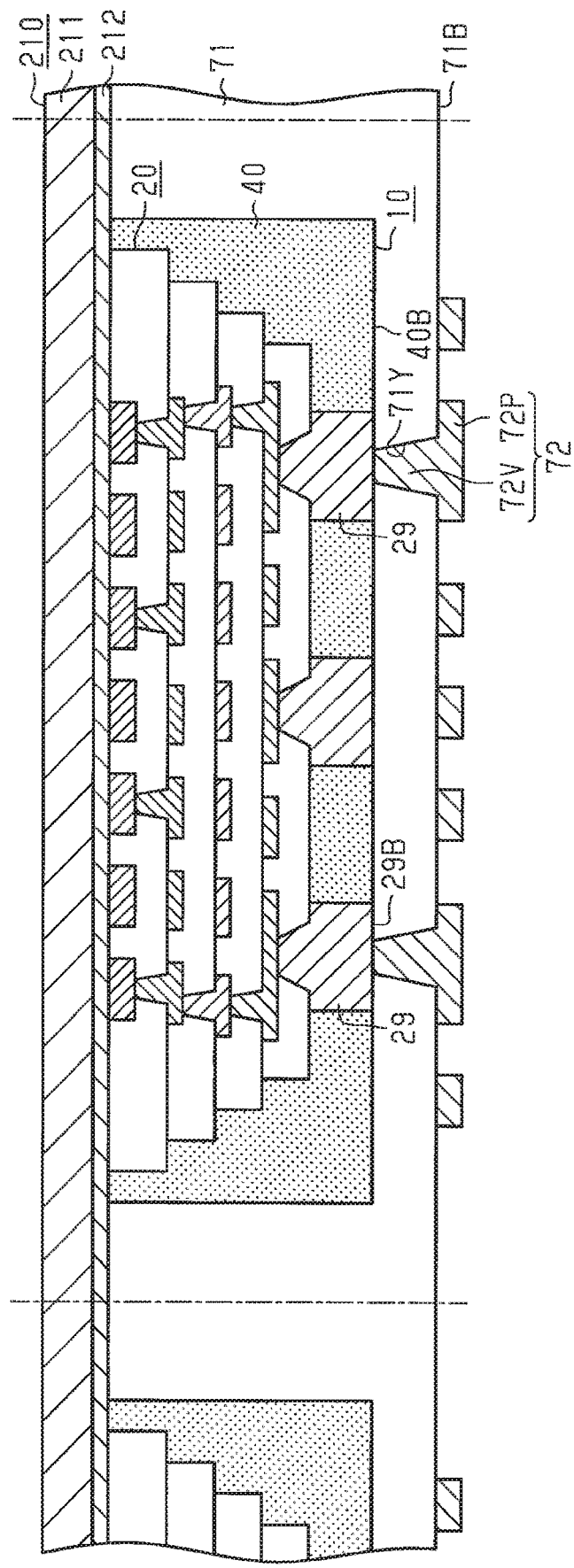

In the step illustrated in FIG. 14, the wiring layer 72 is formed including the via wirings 72V and the wiring patterns 72P. The through holes 71Y of the insulation layer 71 are filled with the via wirings 72V. The wiring patterns 72P are formed on the lower surface 71B of the insulation layer 71 and electrically connected by the via wirings 72V to the wiring layer 29. Any of various types of wiring formation processes such as a semi-additive process or a subtractive process may be employed to form the wiring layer 72.

Figure 15:
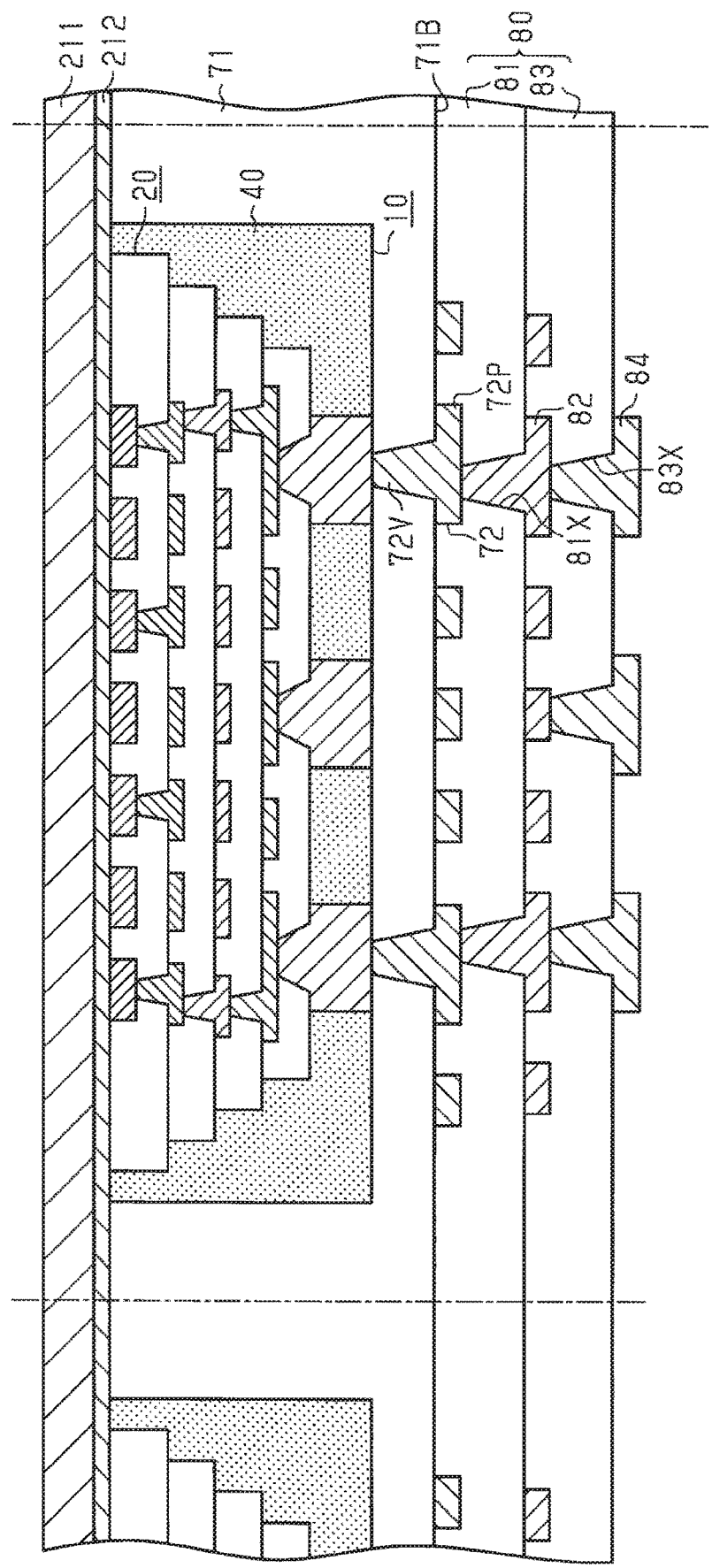

In the step illustrated in FIG. 15, the insulation layer 81, which includes the through holes 81X partially exposing the lower surface of the wiring layer 72, is formed on the lower surface 71B of the insulation layer 71 in the same manner as the step illustrated in FIG. 13. Then, in the same manner as the step illustrated in FIG. 14, for example, a semi-additive process is performed to form the wiring layer 82 including via wirings and wiring patterns. The through holes 81X are filled with the via wirings. The wiring patterns are formed on the lower surface of the insulation layer 81 and electrically connected by the via wirings to the wiring layer 72. Further, in the same manner as the step illustrated in FIG. 13, the insulation layer 83, which includes the through holes 83X partially exposing the lower surface of the wiring layer 82, is formed on the lower surface of the insulation layer 81. Then, in the same manner as the step illustrated in FIG. 14, for example, a semi-additive process is performed to form the wiring layer 84 including via wirings and wiring patterns. The through holes 83X are filled with the via wirings. The wiring patterns are formed on the lower surface of the insulation layer 83 and electrically connected by the via wirings to the wiring layer 82.

Figure 16:
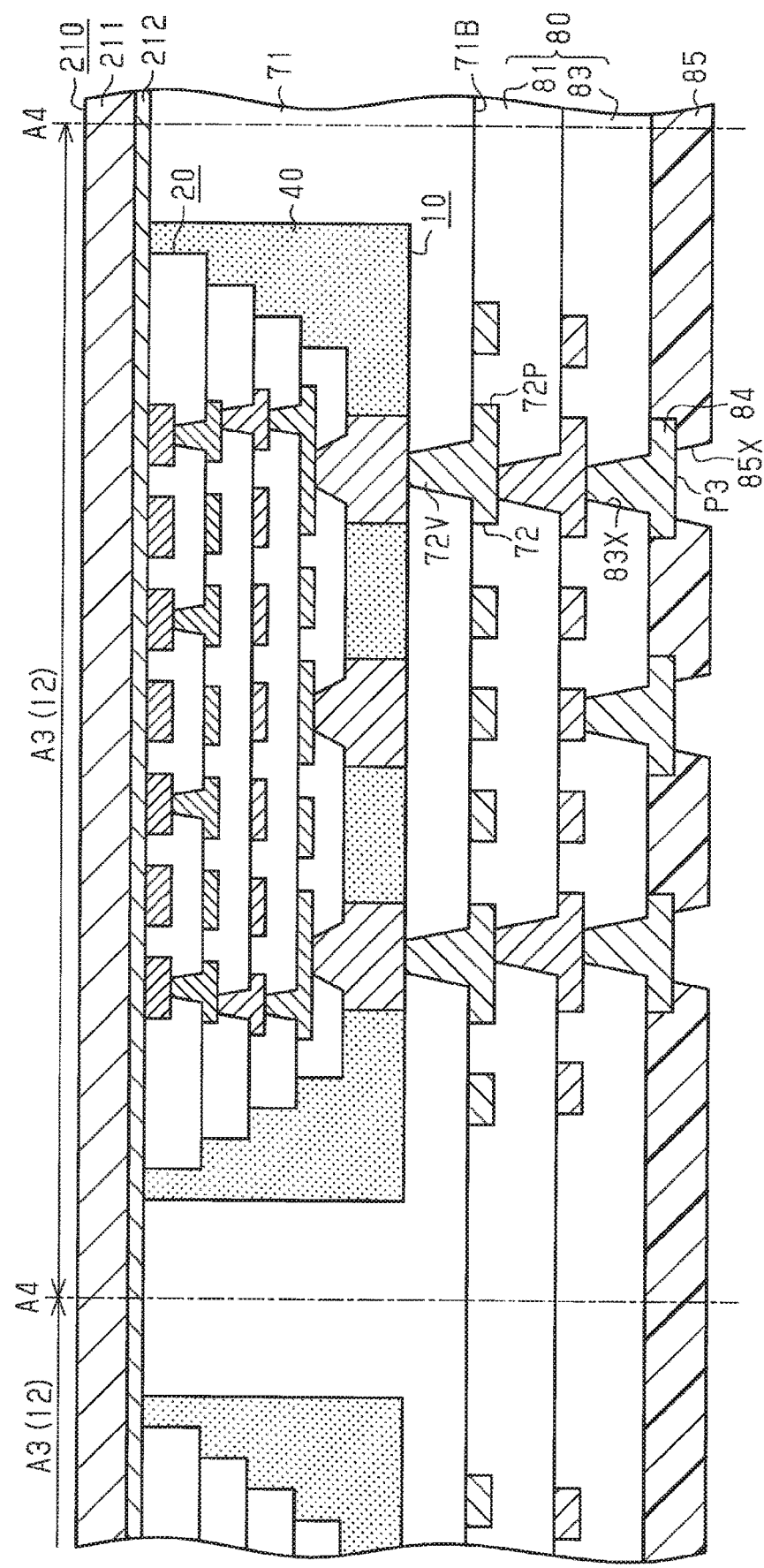

In the step illustrated in FIG. 16, the solder resist layer 85, which includes the openings 85X partially exposing the lower surface of the wiring layer 84 as the external connection pads P3, is formed on the lower surface of the insulation layer 83. The solder resist layer 85 may be formed by, for example, laminating a photosensitive solder resist film or applying a liquid of solder resist and performing photolithography to pattern the resist.

Through the manufacturing steps described above, the wiring substrate 12 is formed on the support substrate 210 in each singulation region A3.

Figure 17:
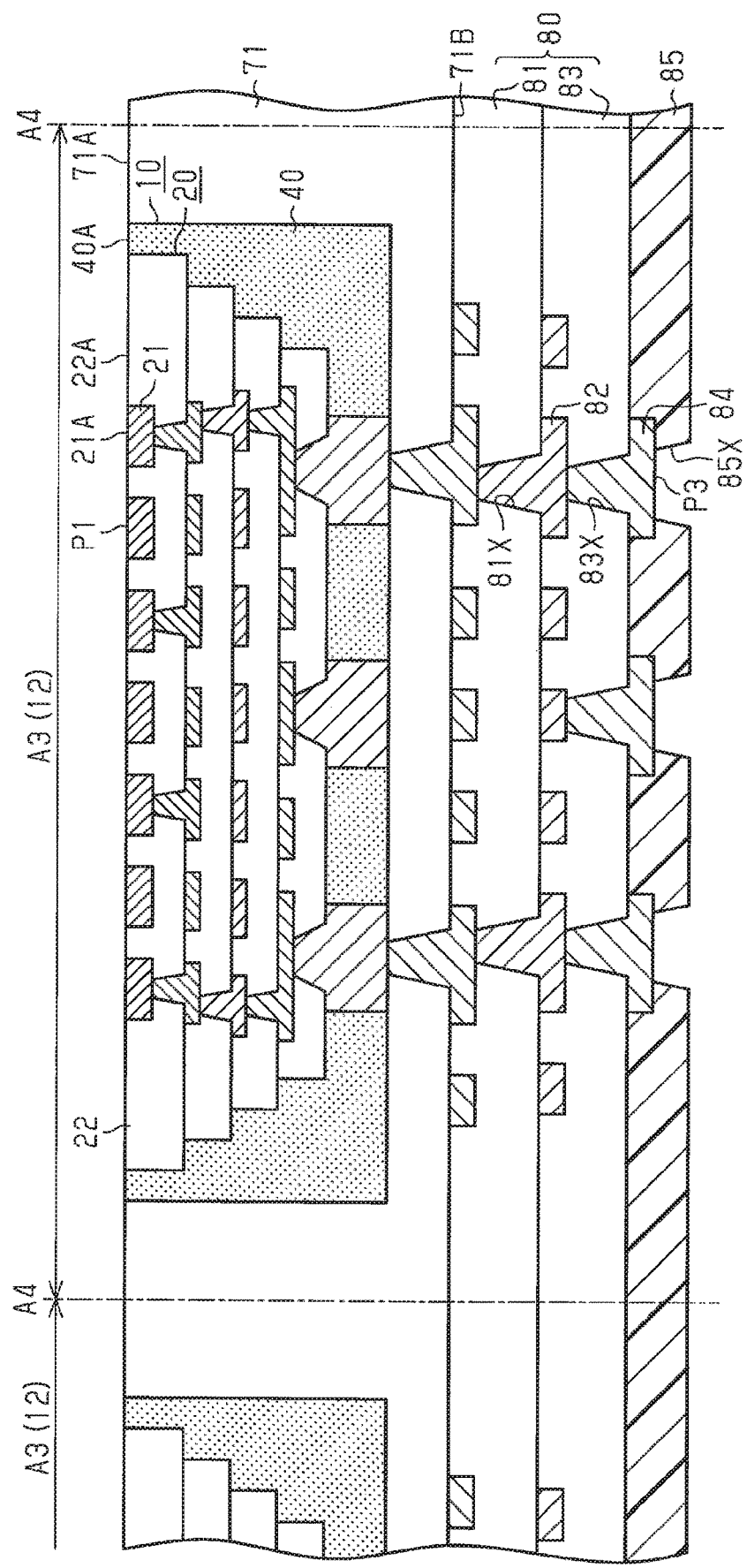

Then, the support substrate 210 is removed. For example, to decrease the adhesive force of the delamination layer 212, ultraviolet light irradiation (in case delamination layer 212 is UV delamination adhesive), heating (in case delamination layer 212 is thermal delamination adhesive), or laser light irradiation (in case delamination layer 212 is laser delamination adhesive) is performed. The delamination layer 212 and the support body 211 are mechanically delaminated from the insulation layer 71. With reference to FIG. 17, this exposes the upper surface 71A of the insulation layer 71, the upper surface 40A of the insulation layer 40, the upper surface 22A of the insulation layer 22, and the upper surface 21A of the wiring layer 21 to the outside. The upper surface 71A of the insulation layer 71, the upper surface 40A of the insulation layer 40, the upper surface 22A of the insulation layer 22, and the upper surface 21A of the wiring layer 21, which were in contact with the lower surface 212B of the delamination layer 212 (refer to FIG. 16) prior to the removal of the support substrate 210, are shaped in conformance with the lower surface 212B of the delamination layer 212 (flat surface). Thus, the upper surface 71A of the insulation layer 71, the upper surface 40A of the insulation layer 40, the upper surface 22A of the insulation layer 22, and the upper surface 21A of the wiring layer 21 are substantially flush with one another.

Figure 18:
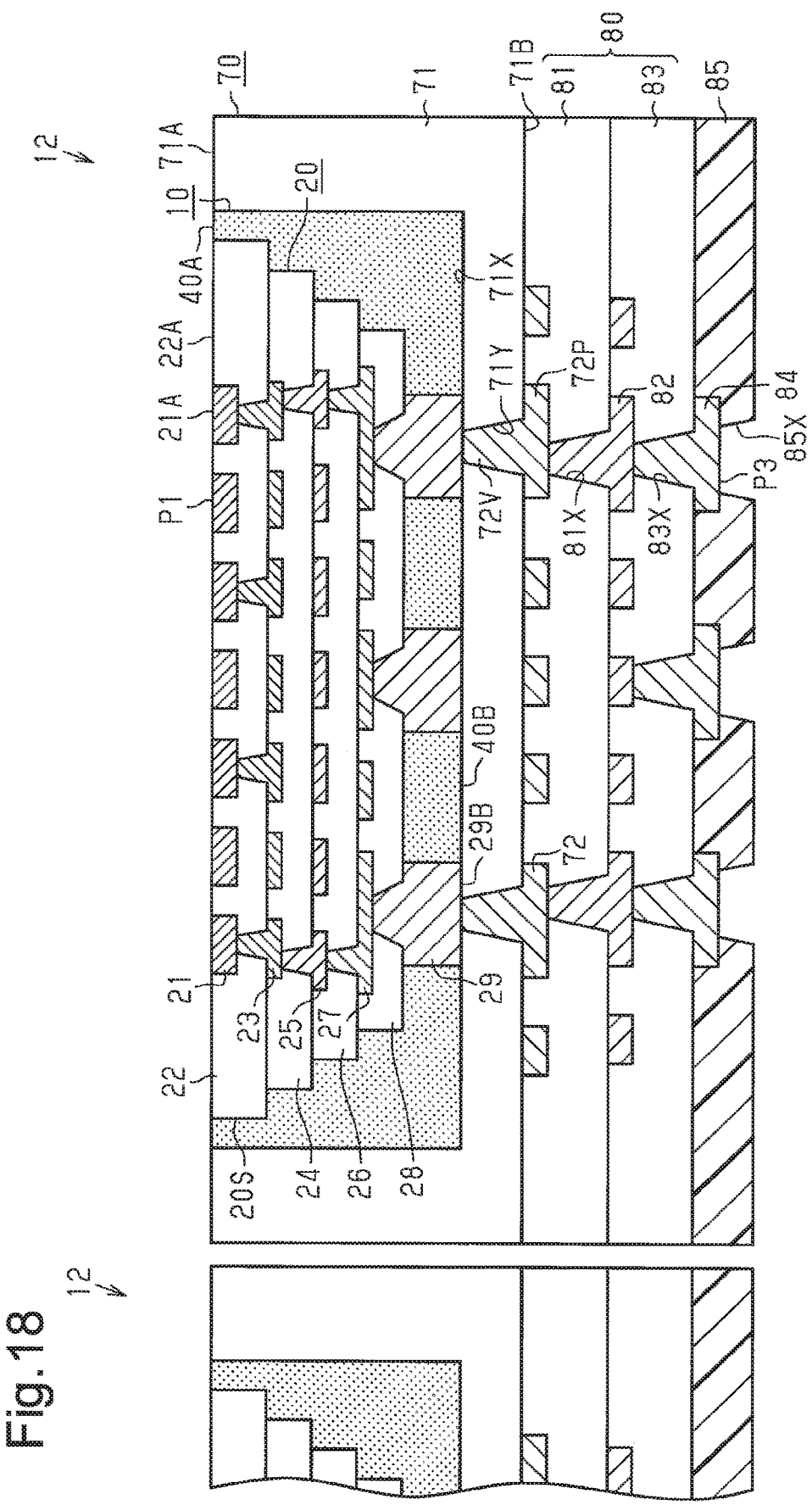

The structure illustrated in FIG. 17 is cut along the cutting lines A4 by a dicing blade or the like. In the present example, the insulation layers 71, 81, and 83 and the solder resist layer 85 are cut along the cutting lines A4. With reference to FIG. 18, this singulates the wiring substrates 12 into individual wiring substrates 12 of the present embodiment.

The singulated wiring substrate 12 may be used upside down or arranged at any angle.

In addition to advantages (1) to (6) of the first embodiment, the second embodiment has the advantages described below.

(7) The wiring substrate 10 is incorporated in the wiring substrate 70. Thus, the wiring layers 72, 82, and 84 in the wiring substrate 70 allow for a sufficient wiring layout when sufficient a wiring layout cannot be obtained with only the fine wiring layers 21, 23, 25, 27, and 29 in the wiring substrate 10.

(8) The insulation layer 71, which covers the side surfaces and the lower surface of the insulation layer 40 of the wiring substrate 10, is formed from the same type of resin material as the insulation layer 40. Thus, the insulation layer 40 and the insulation layer 71 have the same coefficient of thermal expansion and limit warping of the wiring substrate 12.

Third Embodiment

A third embodiment will now be described with reference to FIGS. 19 to 25. Same reference numerals are given to those components that are the same as the corresponding components illustrated in FIGS. 1 to 18. Such components will not be described in detail.

The structure of a wiring substrate 14 will now be described with reference to FIG. 19.

The wiring substrate 14 includes the stack 20, an insulation layer 41 covering the lower surface of the stack 20 and entirely covering the side surfaces 20S of the stack 20, a wiring structure 90 formed on the lower surface 41B of the insulation layer 41, and a solder resist layer 96 formed on the lower surface of the wiring structure 90.

The wiring layer 21, the insulation layer 22, the wiring layer 23, the insulation layer 24, the wiring layer 25, the insulation layer 26, the wiring layer 27, the insulation layer 28, and the wiring layer 29 are sequentially stacked in the stack 20. The side surfaces 20S of the stack 20 are stepped.

The insulation layer 41 covers the lower surface of the stack 20 and entirely covers the side surfaces 20S of the stack 20, while exposing the upper surface of the stack 20. The insulation layer 41 entirely covers the stepped side surfaces 20S of the stack 20. The insulation layer 41 entirely covers the insulation layers 22, 24, 26, and 28 that form the steps. In the example of FIG. 19, the insulation layer 41 entirely covers the side surfaces 20S of the stack 20 formed by the side surfaces and the lower surface 22B of the insulation layer 22, the side surfaces and the lower surface 24B of the insulation layer 24, the side surfaces and the lower surface 26B of the insulation layer 26, and the side surfaces and the lower surface 28B of the insulation layer 28.

The insulation layer 41 entirely covers the lower surface 28B of the lowermost insulation layer 28 of the stack 20, entirely covers the side surfaces of the connection terminals 29P, and partially covers the lower surface 29B of the lowermost wiring layer 29. The insulation layer 41 entirely exposes the upper surface of the stack 20. In the example of FIG. 19, the insulation layer 41 entirely exposes the upper surface 21A of the wiring layer 21 and the upper surface 22A of the insulation layer 22. For example, an upper surface 41A of the insulation layer 41 is flush with the upper surface 21A of the wiring layer 21 and the upper surface 22A of the insulation layer 22. The outer side surfaces of the insulation layer 41 form parts of the side surfaces of the wiring substrate 14.

The insulation layer 41 includes through holes 41X that open at given locations in the lower surface 41B. The through holes 41X extend through the insulation layer 41 in the thickness-wise direction and partially expose the lower surface 29B of the wiring layer 29. The through holes 41X are each tapered so that the diameter decrease from the lower surface 41B of the insulation layer 41 (lower side in FIG. 19) toward the upper surface 41A of the insulation layer 41 (upper side in FIG. 19). For example, the through holes 41X each have the form of a substantially truncated conical hole of which the upper open end has a smaller diameter than the lower open end.

The insulation layer 41 may be an insulative resin having higher mechanical strength (rigidity, hardness, or the like) than the insulation layers 22, 24, 26, and 28. The material of the insulation layer 41 may be an insulative resin having higher mechanical strength (rigidity, hardness, or the like) than the photosensitive resin forming the insulation layers 22, 24, 26, and 28. The material of the insulation layer 41 may be, for example, a non-photosensitive, insulative resin of which the main component is a thermosetting resin. The material of the insulation layer 41 may be, for example, a thermosetting resin, such as an epoxy resin or a polyimide resin, or a resin material obtained by mixing a filler such as silica or alumina with such a thermosetting resin. The material of the insulation layer 41 may be, for example, an insulative resin in which reinforcement material is added to a thermosetting resin. The material of the insulation layer 41 may be, for example, a glass epoxy resin formed by impregnating a glass cloth, which is reinforcement material, with a thermosetting insulative resin, of which the main component is epoxy resin. The reinforcement material is not limited to glass cloth and may be, for example, a glass non-woven cloth, an aramid cloth, an aramid non-woven cloth, an LCP cloth, or an LCP non-woven cloth. The thermosetting insulative resin is not limited to epoxy resin and may be, for example, an insulative resin such as a polyimide resin or a cyanate resin.

The wiring structure 90 will now be described.

The wiring structure 90 is formed on the lower surface 41B of the insulation layer 41. The wiring structure 90 is a low-density wiring layer including wiring layers in a lower wiring density than, for example, the stack 20).

The wiring structure 90 includes a wiring layer 91, an insulation layer 92, a wiring layer 93, an insulation layer 94, and a wiring layer 95 that are sequentially stacked on the lower surface 41B of the insulation layer 41.

The material of the insulation layers 92 and 94 may be a non-photosensitive resin of which the main component is a thermosetting resin. The material of the insulation layers 92 and 94 may be, for example, a thermosetting resin, such as an epoxy resin or a polyimide resin, or a resin material obtained by mixing a filler such as silica or alumina with such a thermosetting resin. In the present example, the insulation layer 94 is formed by an insulative resin including reinforcement material. For example, the insulation layer 94 of the present example includes a given number of (in this example, one) glass cloth 94G. The material of the wiring layers 91, 93, and 95 may be, for example, copper or a copper alloy.

The insulation layers 92 and 94 are thicker than the insulation layers 22, 24, 26, and 28 in the stack 20. The insulation layers 92 and 94 may each have a thickness of, for example, approximately 30 to 70 μm. The wiring layers 91, 93, and 95 are thicker than the wiring layers 21, 23, 25, 27, and 29 in the stack 20. The wiring layers 91, 93, and 95 respectively formed on the insulation layers 41, 92, and 94 may each have a thickness of, for example, approximately 15 to 35 μm. The wiring layers 91, 93, and 95 have larger wiring widths and wiring intervals than the wiring layers 21, 23, 25, 27, and 29 in the stack 20. The line-and-space (L/S) of each of the wiring layers 91, 93, and 95 is, for example, approximately 20 μm/20 μm.

The wiring layer 91 is formed on the lower surface 41B of the insulation layer 41. The wiring layer 91 is electrically connected to the lowermost wiring layer 29 of the stack 20. The wiring layer 91 includes, for example, via wirings 91V and wiring patterns 91P. The through holes 41X are filled with the via wirings 91V. The wiring patterns 91P are laid out on the lower surface 41B of the insulation layer 41. For example, the via wirings 91V are formed integrally with the wiring patterns 91P.

The upper surface of the via wiring 91V is directly connected to parts of the lower surface 29B of the wiring layer 29. In the present example, parts of the lower surface 29B of the wiring layer 29 are in contact with the upper surface of the via wiring 91V, and the wiring layer 29 is electrically connected to the via wiring 91V. In other words, the wiring layer 29 and the via wiring 91V are electrically connected but not integrated with each other and are formed as separate bodies.

The insulation layer 92 is formed on the lower surface 41B of the insulation layer 41 covering the wiring layer 91. The insulation layer 92 includes through holes 92X at given locations. The through holes 92X extend through the insulation layer 92 in the thickness-wise direction and partially expose the lower surface of the wiring layer 91.

The wiring layer 93 is electrically connected to the wiring layer 91. The wiring layer 93 includes via wirings and wiring patterns. The through holes 92X are filled with the via wirings. The wiring patterns are formed integrally with the via wirings and laid out on the lower surface of the insulation layer 92.

The insulation layer 94 is formed on the lower surface of the insulation layer 92 covering the wiring layer 93. The insulation layer 94 includes through holes 94X at given locations. The through holes 94X extend through the insulation layer 94 in the thickness-wise direction and partially expose the lower surface of the wiring layer 93.

Figure 19:
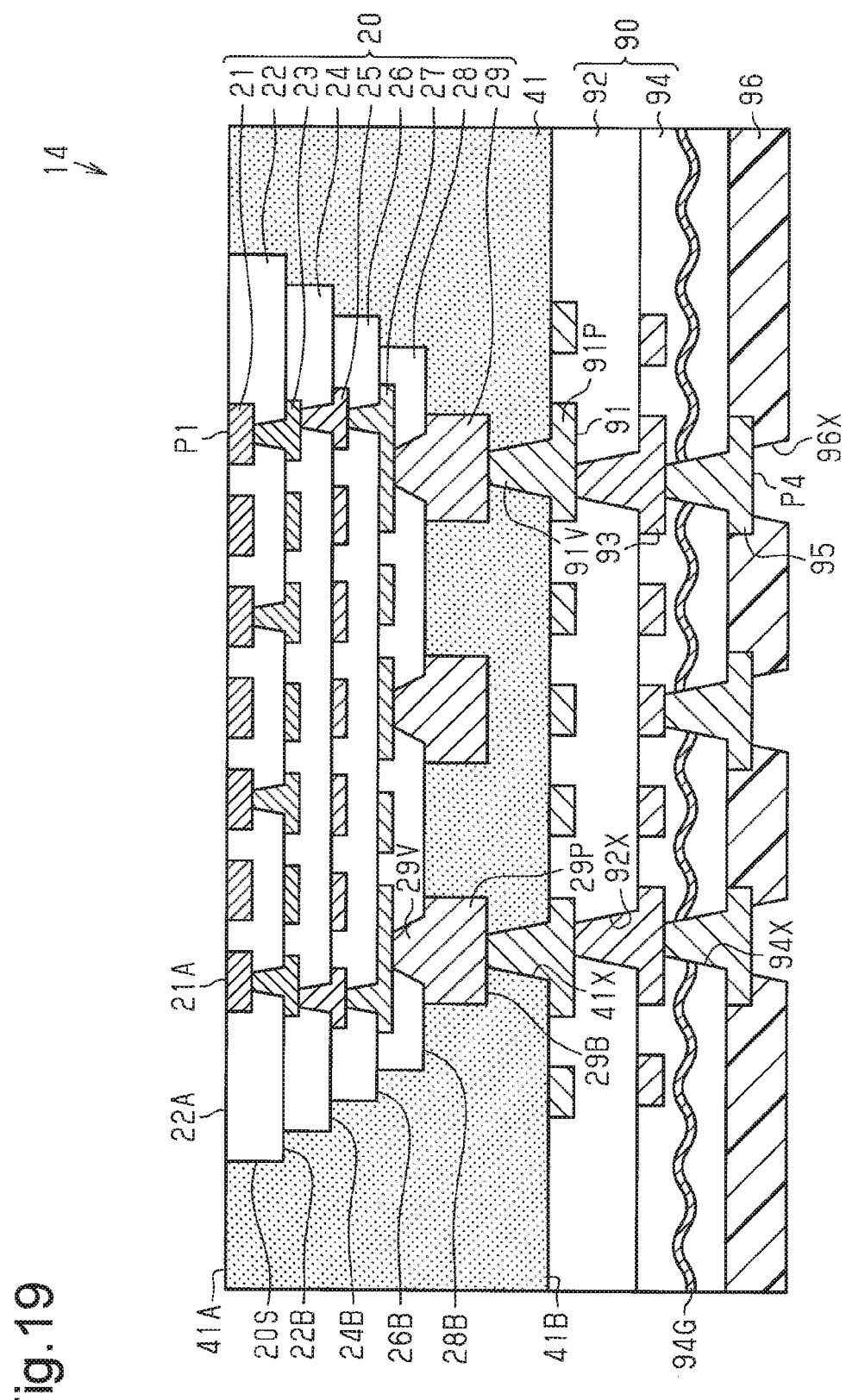
FIG. 19 is a schematic cross-sectional view of a wiring substrate in accordance with a third embodiment.

The through holes 92X and 94X are each tapered so that the diameter decreases from the lower side (side of wiring layer 95) toward the upper side (side of wiring layer 91) as viewed in FIG. 19. For example, the through holes 92X and 94X each have the form of a substantially truncated conical hole of which the upper open end has a smaller diameter than the lower open end.

The wiring layer 95 is electrically connected to the wiring layer 93. The wiring layer 95 includes via wirings and wiring patterns. The through holes 94X are filled with the via wirings. The via patterns are formed integrally with the via wirings and laid out on the lower surface of the insulation layer 94.

The solder resist layer 96 is an outermost (lowermost) protective insulation layer formed on the lower surface of the wiring structure 90. The solder resist layer 96 is formed on the lower surface of the insulation layer 94 covering the wiring layer 95. The solder resist layer 96 includes openings 96X at given locations. The openings 96X extend through the solder resist layer 96 in the thickness-wise direction and partially expose the lower surface of the wiring layer 95 as external connection pads P4. The external connection pads P4 may be connected to the external connection terminals 86 (refer to FIG. 20), such as solder bumps and lead pins, to mount the wiring substrate 14 on a mounting substrate such as a motherboard. When necessary, a surface-processed layer may be formed on the wiring layer 95 exposed from the openings 96X. Examples of the surface-processed layer include an Au layer, a Ni/Au layer, a Ni/Pd/Au layer, or an OSP film. Further, the wiring layer 95 exposed from the openings 96X or the surface-processed layer formed on the wiring layer 95 may be used as external connection terminals.

The openings 96X and the external connection pads P4 may have any planar shape or size. For example, the openings 96X and the external connection pads P4 may be circular and have a diameter of approximately 200 to 1000 μm. The material of the solder resist layer 96 may be, for example, a photosensitive insulative resin of which the main component is a phenol resin or a polyimide resin. The solder resist layer 96 may include, for example, a filler such as silica or alumina.

The structure of a semiconductor device 15 will now be described with reference to FIG. 20.

The semiconductor device 15 includes the wiring substrate 14, the semiconductor chip 60, and the external connection terminals 86.

The semiconductor chip 60 is mounted on the upper surface of the wiring substrate 14. The semiconductor chip 60 is, for example, flip-chip-mounted on the wiring substrate 14. In the present example, the bumps 61 on the circuit formation surface (in this case, lower surface) of the semiconductor chip 60 are bonded with the connection pads P1 of the wiring substrate 14. The bumps 61 electrically connect the semiconductor chip 60 to the wiring layer 21.

The external connection terminals 86 are formed on the external connection pads P4 of the wiring substrate 14. The external connection terminals 86 may be, for example, solder bumps or lead pins. In the present example, solder bumps are used as the external connection terminals 86.

A method for manufacturing the wiring substrate 14 will now be described with reference to FIGS. 21A to 25. A batch manufacturing process will now be described in which a batch of wiring substrates 14 are formed and then singulated into individual wiring substrates 14. To facilitate description, same reference numbers are given to the elements of the wiring substrate 14 obtained during the manufacturing process that are the same as the corresponding elements in the final product of the wiring substrate 14.

In the step illustrated in FIG. 21A, the large support substrate 200 is prepared including the singulation regions A1 in which wiring substrates 14 are formed. The support substrate 200 may be, for example, a metal plate or a metal foil. Then, the metal film 201 is formed on the lower surface of the support substrate 200 entirely covering the lower surface of the support substrate 200. The material of the metal film 201 may be, for example, a metal, such as Ni, Ti, Cr, Sn, Co, Fe, or Pd, or an alloy including at least one selected from these metals. Further, the wiring layer 21, the insulation layer 22, the wiring layer 23, the insulation layer 24, the wiring layer 25, the insulation layer 26, the wiring layer 27, the insulation layer 28, and the wiring layer 29 are sequentially stacked on the lower surface 201B of the metal film 201 in each singulation region A1 to form the stack 20.

In the step illustrated in FIG. 21B, the insulation layer 41, which encapsulates the stack 20, is formed on the lower surface 201B of the metal film 201. The insulation layer 41 entirely covers the side surfaces 20S and lower surface of the stack 20. In the present example, the insulation layer 41 entirely covers the lower surface 28B of the insulation layer 28, the side surface of each connection terminal 29P, and lower surface 29B of each connection terminal 29P. The space between the stack 20 and an adjacent stack 20 is filled with the insulation layer 41.

When using a resin film as the insulation layer 41, the resin film is laminated on the lower surface 201B of the metal film 201. The resin film is pressed and hardened by undergoing a heat treatment at a temperature higher than or equal to the hardening temperature (e.g., approximately 130° C. to 200° C.) to form the insulation layer 41. The resin film can be laminated in a vacuum atmosphere to prevent the formation of voids. The resin film may be, for example, a film of a thermosetting resin of which the main component is an epoxy resin. When a liquid or paste of an insulative resin is used as the insulation layer 41, spin coating is performed to apply the liquid or paste of insulative resin to the lower surface 201B of the metal film 201. The applied insulative resin is hardened by undergoing a heat treatment at a temperature greater than or equal to the hardening temperature to form the insulation layer 41. The liquid or paste of insulative resin may be, for example, a thermosetting resin of which the main component is an epoxy resin.

When using, for example, a thermosetting mold resin as the material of the insulation layer 41, the structure illustrated in FIG. 21A is arranged in a mold. Then, pressure (e.g., 5 to 10 MPa) is applied to the mold to charge the mold with a fluidized mold resin. The mold resin is heated to approximately 180° and then hardened to form the insulation layer 41. The mold may be charged with mold resin by performing a transfer molding process, a compression molding process, an inkjet molding process, or the like.

Figure 22:
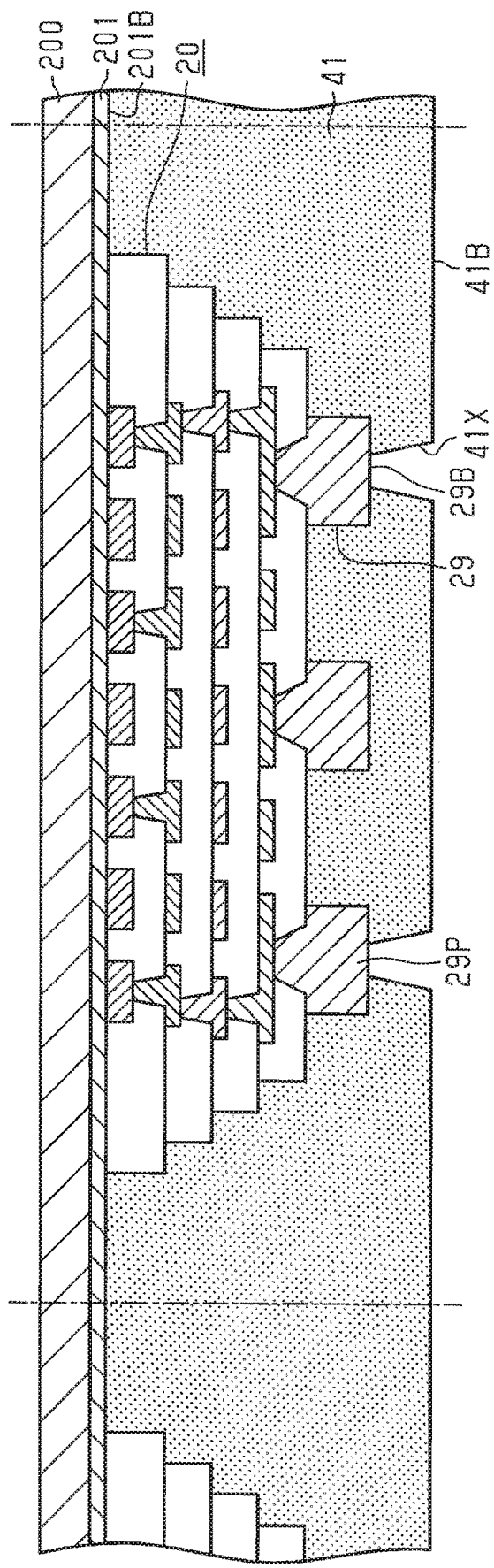

In the step illustrated in FIG. 22, the through holes 41X are formed in the insulation layer 41 at given locations to partially expose the lower surface 29B of the wiring layer 29 of the stack 20. The through holes 41X are formed, for example, by performing a laser process using a $CO_2$ laser or a UV-YAG laser. When forming the through holes 41X through a laser process, a desmearing process is performed to remove resin smears from the surface of the wiring layer 29 exposed from the bottom of each through hole 41X.

Figure 23:
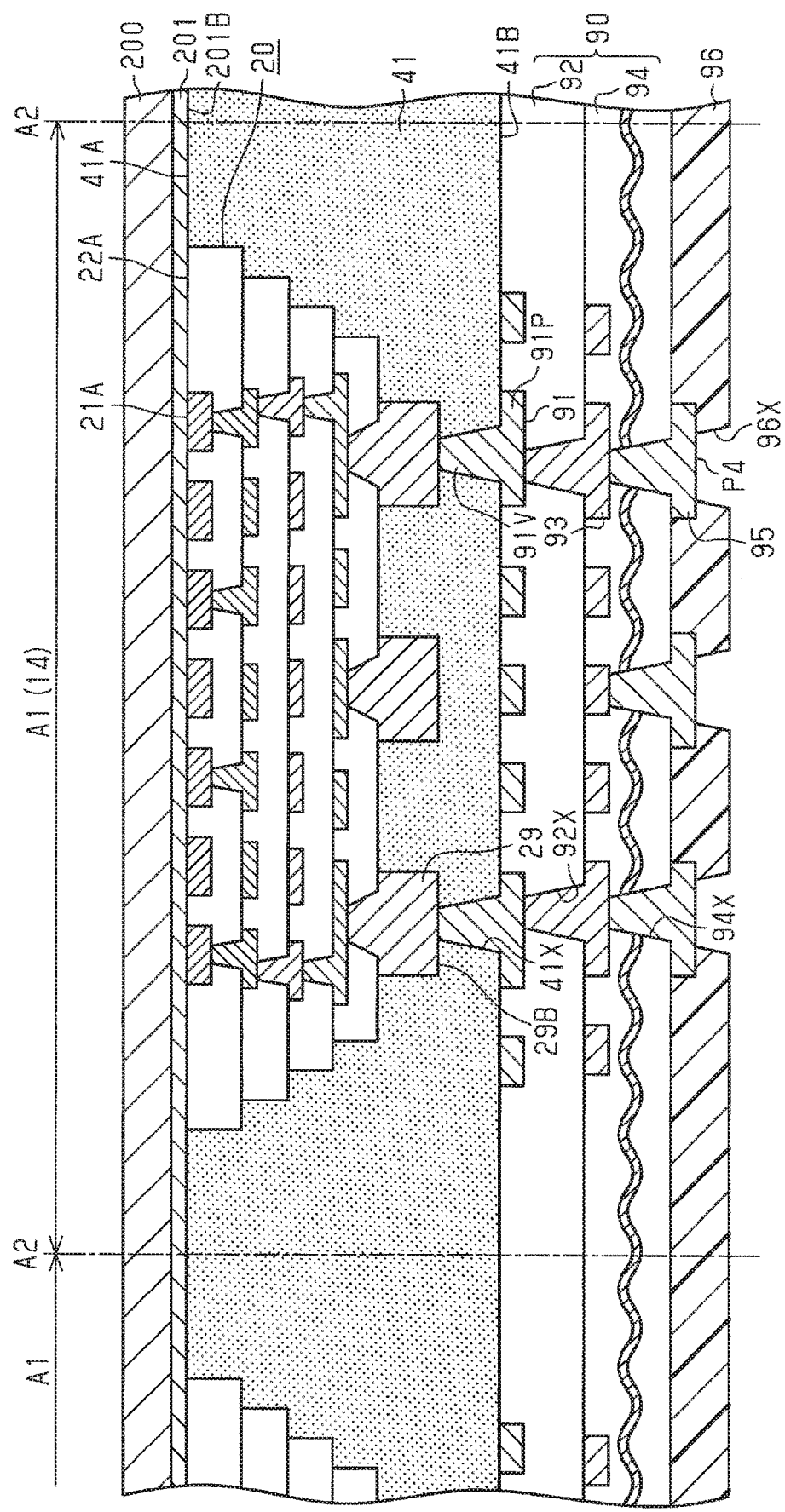

In the step illustrated in FIG. 23, the wiring layer 91 is formed including the via wirings 91V and the wiring patterns 91P. The through holes 41X of the insulation layer 41 are filled with the via wirings 91V. The wiring patterns 91P are formed on the lower surface 41B of the insulation layer 41 and electrically connected by the via wirings 91V to the wiring layer 29. Any of various types of wiring formation processes such as a semi-additive process or a subtractive process may be employed to form the wiring layer 91.

In the same manner as the step illustrated in FIG. 22, the insulation layer 92, which includes the through holes 92X partially exposing the lower surface of the wiring layer 91, is formed on the lower surface 41B of the insulation layer 41. Further, for example, a semi-additive process is performed to form the wiring layer 93 including via wirings and wiring patterns. The through holes 92X are filled with the via wirings. The wiring patterns are formed on the lower surface of the insulation layer 92 and electrically connected by the via wirings to the wiring layer 91. Then, in the same manner as the step illustrated in FIG. 22, the insulation layer 94, which includes the through holes 94X partially exposing the lower surface of the wiring layer 93, is formed on the lower surface of the insulation layer 92. Further, for example, a semi-additive process is performed to form the wiring layer 95 including via wirings and wiring patterns. The through holes 94X are filled with the via wirings. The wiring patterns are formed on the lower surface of the insulation layer 94 and electrically connected by the via wirings to the wiring layer 93.

The solder resist layer 96, which includes the openings 96X partially exposing the lower surface of the wiring layer 95 as the external connection pads P4, is formed on the lower surface of the insulation layer 94. The solder resist layer 96 may be formed by, for example, laminating a photosensitive solder resist film or applying a liquid of solder resist and performing photolithography to pattern the resist.

Through the manufacturing steps described above, the wiring substrate 14 is formed on the support substrate 200 in each singulation region A1.

Figure 24:
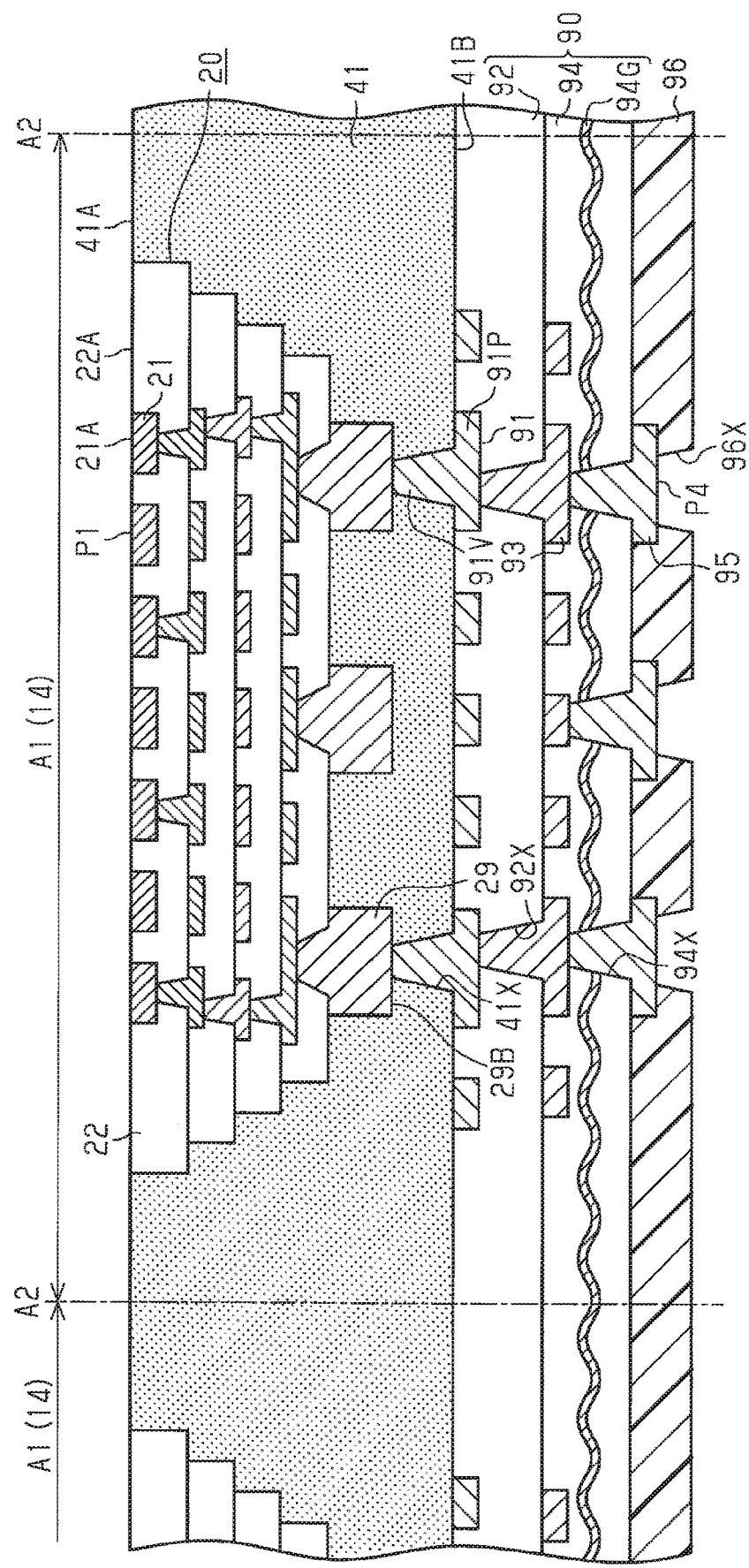

Then, the support substrate 200 is removed, and the metal film 201 is etched and removed. As illustrated in FIG. 24, the present step exposes the upper surface 21A of the wiring layer 21, the upper surface 22A of the insulation layer 22, and the upper surface 41A of the insulation layer 41. The upper surface 21A of the wiring layer 21, the upper surface 22A of the insulation layer 22, and the upper surface 41A of the insulation layer 41, which were in contact with the lower surface 201B of the metal film 201 (refer to FIG. 23), are shaped in conformance with the lower surface 201B of the metal film 201 (flat surface). Thus, the upper surface 21A of the wiring layer 21, the upper surface 22A of the insulation layer 22, and the upper surface 41A of the insulation layer 41 are substantially flush with each other.

Figure 25:
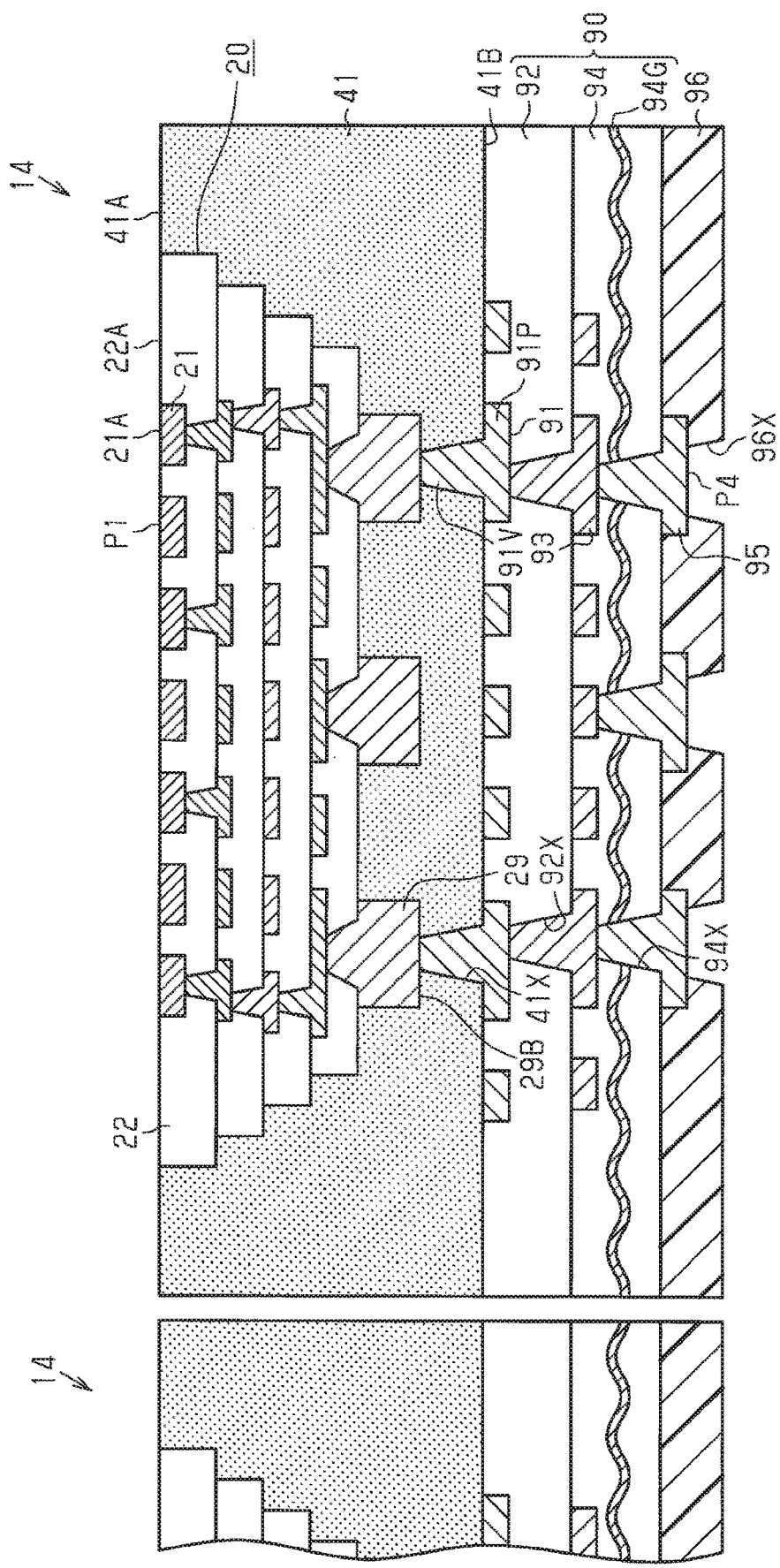

The structure illustrated in FIG. 24 is cut along the cutting lines A2 by a dicing blade or the like. In the present example, the insulation layers 41, 92, and 94 and the solder resist layer 96 are cut along the cutting lines A2. With reference to FIG. 25, this singulates the wiring substrates 14 into individual wiring substrates 14 of the present embodiment.

The singulated wiring substrate 14 may be used upside down or arranged at any angle.

In addition to advantages (1) to (6) of the first embodiment and advantage (7) of the second embodiment, the third embodiment has the advantage described below.

(9) The wiring structure 90 is formed on the lower surface 41B of the insulation layer 41. The wiring structure 90 further increases the rigidity of the wiring substrate 14. This limits warping and bending of the wiring substrate 14 even after removal of the support substrate 200.

It should be apparent to those skilled in the art that the foregoing embodiments may be implemented in many other specific forms without departing from the scope of this disclosure. Particularly, it should be understood that the foregoing embodiments may be implemented in the following forms. It should be noted that the foregoing embodiments and the following modifications may be combined appropriately as long as the combination is not technically inconsistent.

In the wiring structure 90 of the third embodiment, the wiring layers 91, 93, and 95 and the insulation layers 92 and 94 may be changed or modified in relation to the number of layers or the wiring layout.

Figure 26:
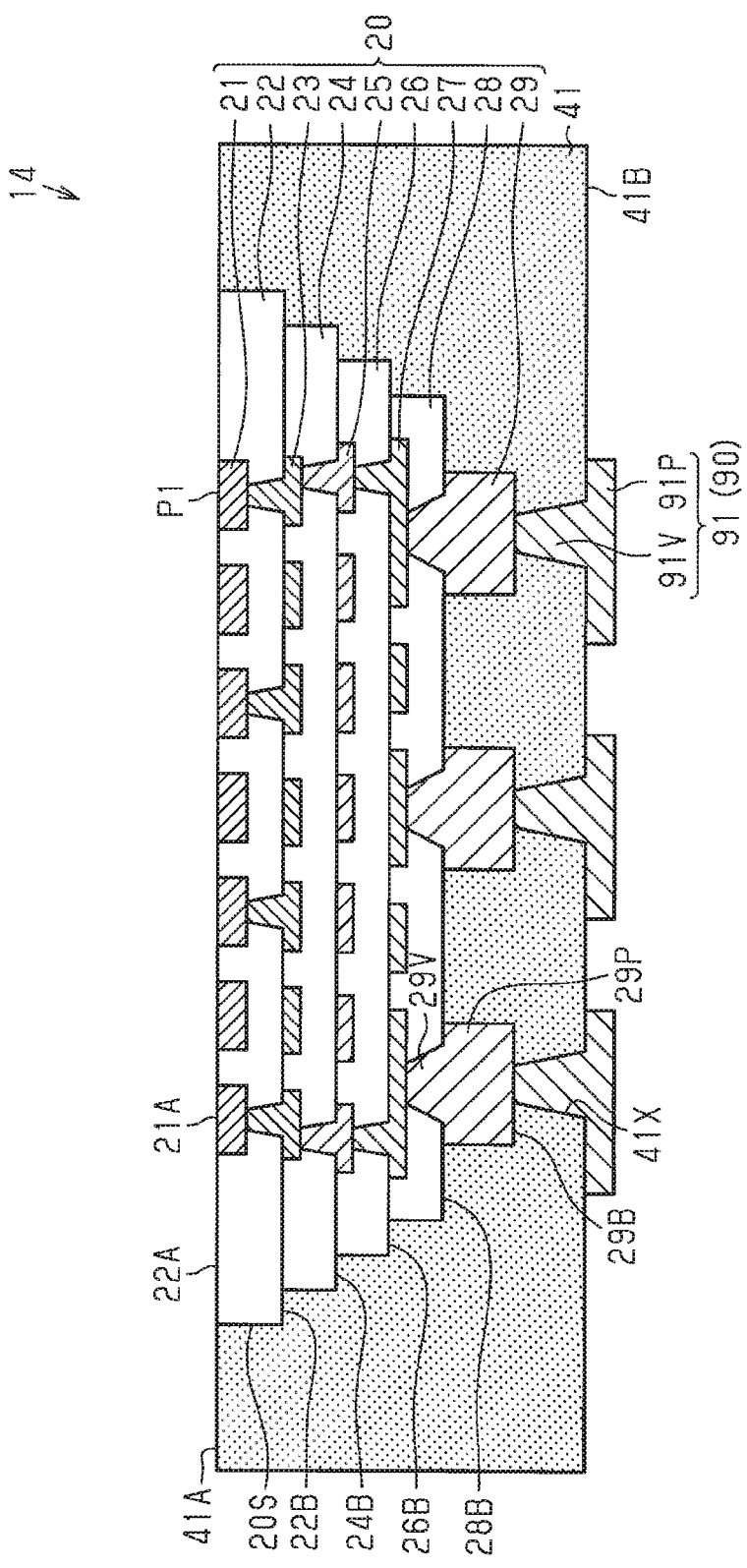
FIGS. 26 to 28 are schematic cross-sectional views illustrating a method for manufacturing the wiring substrate of FIG. 19.

For example, as illustrated in FIG. 26, the wiring structure 90 may be formed by only the wiring layer 91. In other words, the wiring layer 93 and 95 and the insulation layers 92 and 94 illustrated in FIG. 19 may be omitted.

The solder resist layer 96 may be omitted from the third embodiment.

In the wiring substrate 70 of the second embodiment, the wiring layers 72, 82, and 84 and the insulation layers 71, 81, and 83 may be changed or modified in relation to the number of layers or the wiring layout. For example, the insulation layer 71 covering the side surfaces and lower surface of the wiring substrate 10 may be formed by a plurality of insulation layers. Further, a wiring layer may be formed in the insulation layer 71. For example, a wiring layer formed on the same plane as the uppermost wiring layer 21 of the stack 20 may be formed in the insulation layer 71. In this case, the upper surface of the wiring layer is, for example, substantially flush with the upper surface 71A of the insulation layer 71 and exposed to the outside from the insulation layer 71.

The wiring structure 80 of the second embodiment may be changed to a cored buildup structure including a core substrate.

The solder resist layer 85 may be omitted from the second embodiment.

The structure of the stack 20 is not particularly limited in the above embodiments. For example, the wiring layers 21, 23, 25, 27, and 29 and the insulation layers 22, 24, 26, and 28 in the stack 20 may be changed or modified in relation to the number of layers or the wiring layout.

In the above embodiments, the side surfaces 20S of the stack 20 are stepped. However, the side surfaces 20S of the stack 20 do not have to be stepped.

Figure 27:
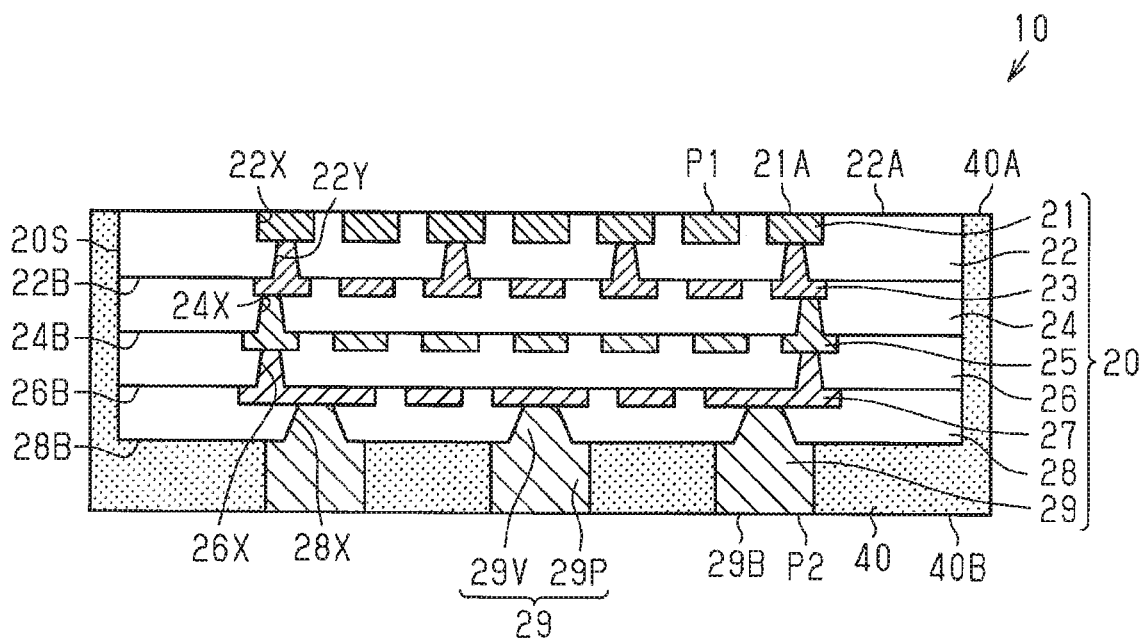

For example, as illustrated in FIG. 27, the side surfaces of the insulation layers 22, 24, 26, and 28 forming the side surfaces 20S of the stack 20 may be flush with one another. In this case, the insulation layer 24 entirely covers the lower surface 22B of the insulation layer 22, the insulation layer 26 entirely covers the lower surface 24B of the insulation layer 24, and the insulation layer 28 entirely covers the lower surface 26B of the insulation layer 26.

Alternatively, steps may be formed in only certain parts of the side surfaces 20S of the stack 20. For example, a step may be formed by a certain one of vertically adjacent pairs of the insulation layers 22, 24, 26, and 28. For example, when the insulation layers 22 and 24 form a vertically adjacent insulation pair, the insulation layer 24 (lower insulation layer) may expose the peripheral portion of the lower surface 22B of the insulation layer 22 (upper insulation layer), and the side surfaces of the other insulation layers 26 and 28 may be flush with the side surface of the insulation layer 24.

In the stack 20 of each embodiment, each connection terminal 29P of the lowermost wiring layer 29 is larger in a plan view than the via wiring 29V. However, the connection terminal 29P of the lowermost wiring layer 29 does not have to be larger in a plan view than the via wiring 29V.

Figure 28:
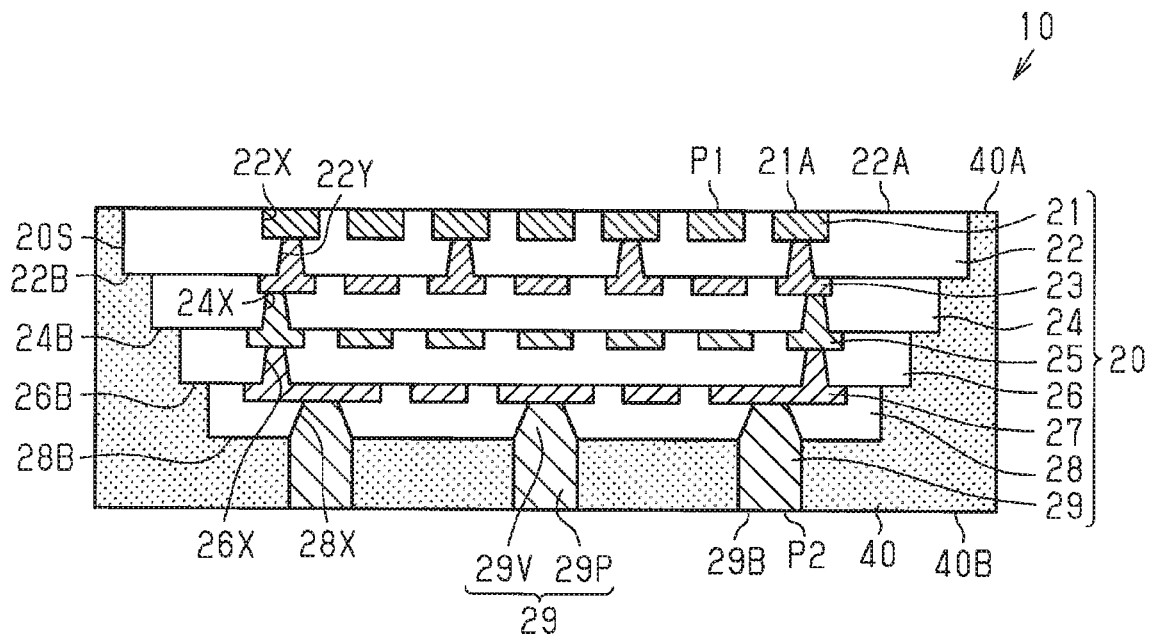

For example, as illustrated in FIG. 28, each connection terminal 29P may have the same size in a plan view as the via wiring 29V. For example, each connection terminal 29P may have the same size in a plan view as the lower surface of the via wiring 29V. Further, each connection terminal 29P may be smaller in size in a plan view than the lower surface of the via wiring 29V.

In the stack 20 of each embodiment, the upper surface 21A of the wiring layer 21 is flush with the upper surface 22A of the insulation layer 22. Instead, for example, the upper surface 21A of the wiring layer 21 may be recessed downward from the upper surface 22A of the insulation layer 22. Further, the upper surface 21A of the wiring layer 21 may be projected upward from the upper surface 22A of the insulation layer 22.

In each embodiment, the side surfaces of the insulation layers 22, 24, 26, and 28 in the stack 20 may be inclined surfaces.

In the first embodiment, the wiring substrate 10 is mounted on the wiring substrate 50 by means of the bumps 54. However, the wiring substrate 10 does not have to be mounted on the wiring substrate 50 in such a manner.

Figure 29:
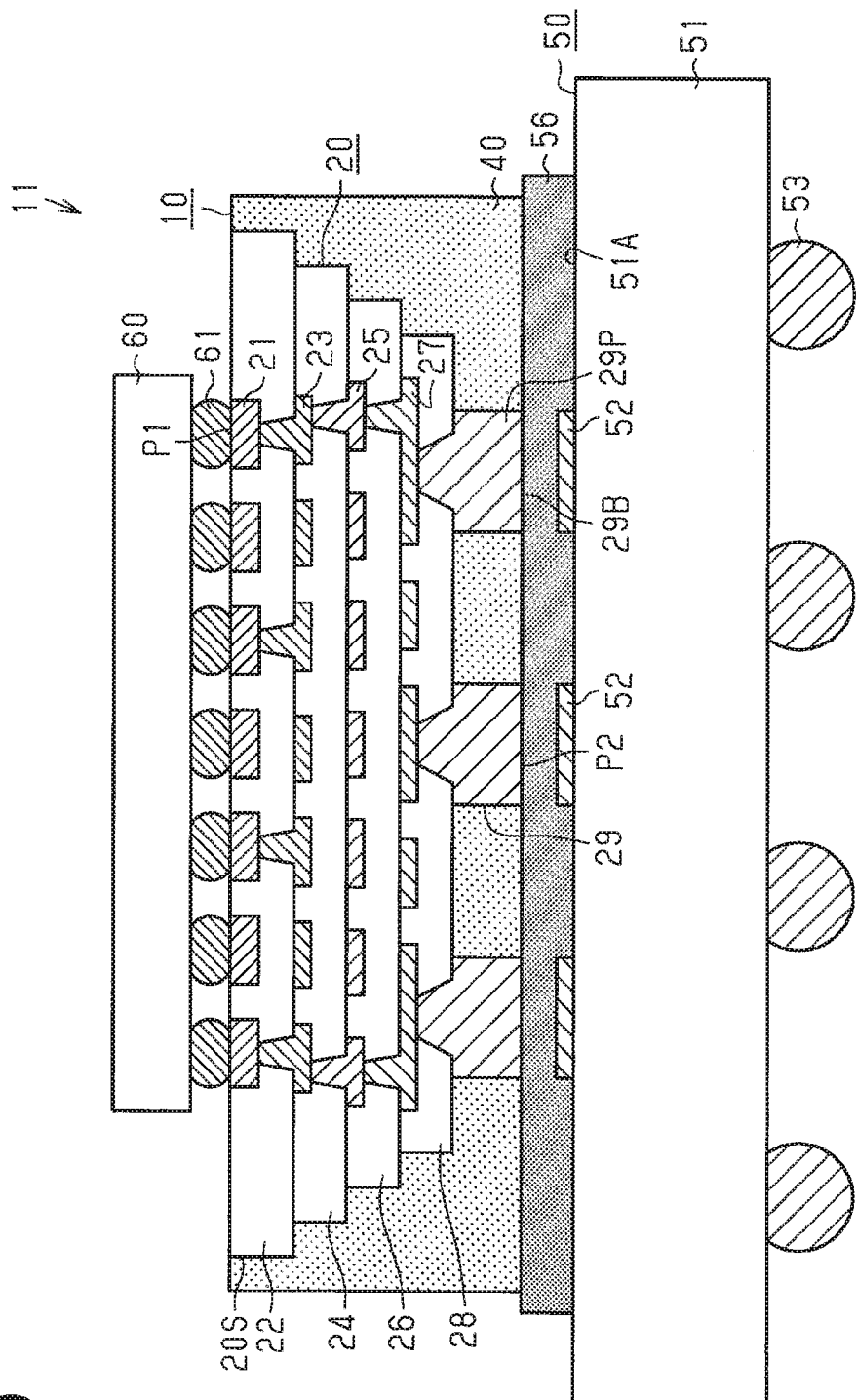
FIG. 29 is a schematic cross-sectional view illustrating a modification of the semiconductor device.

For example, with reference to FIG. 29, an anisotropic conductive film 56 (anisotropic conductive adhesive film) may be used instead of the bumps 54 to mount the wiring substrate 10 on the wiring substrate 50. In this case, the anisotropic conductive film 56 may be located between the upper surface of the wiring substrate 50 and the lower surface of the wiring substrate 10. The anisotropic conductive film 56 is electrically connected to the connection pads P2 of the wiring substrate 10 and the connection pads 52 of the wiring substrate 50. An anisotropic conductive film is a semi-hardened resin film (e.g., thermosetting resin film of an epoxy or the like) in which conductive particles of Ni, Au, Ag, or the like are dispersed. Further, the anisotropic conductive film is conductive in the vertical direction and insulative in the horizontal direction.

The wiring substrate 10 is mounted on the wiring substrate 50 with the anisotropic conductive film 56 by, for example, first applying the semi-hardened anisotropic conductive film 56 to the upper surface 51A of the wiring substrate 50 of the substrate body 51 so as to cover the connection pads 52. Then, the connection pads 52 of the wiring substrate 50 and the connection pads P2 of the wiring substrate 10 are aligned with each other on opposite sides of the anisotropic conductive film 56. The wiring substrate 10 is pressed against the anisotropic conductive film 56 to connect the connection pads 52 and the connection pads P2. In this case, a bonding tool or the like is used to heat and press the wiring substrate 10 against the anisotropic conductive film 56 to harden the semi-hardened anisotropic conductive film 56. The anisotropic conductive film 56 is held and compressed between the connection pads 52 and the connection pads P2. Thus, the dispersed conductive particles in the anisotropic conductive film 56 come into contact with one another. As a result, the anisotropic conductive film 56 becomes conductive in the thickness-wise direction and electrically connects the connection pads 52 and the connection pads P2.

Figure 30:
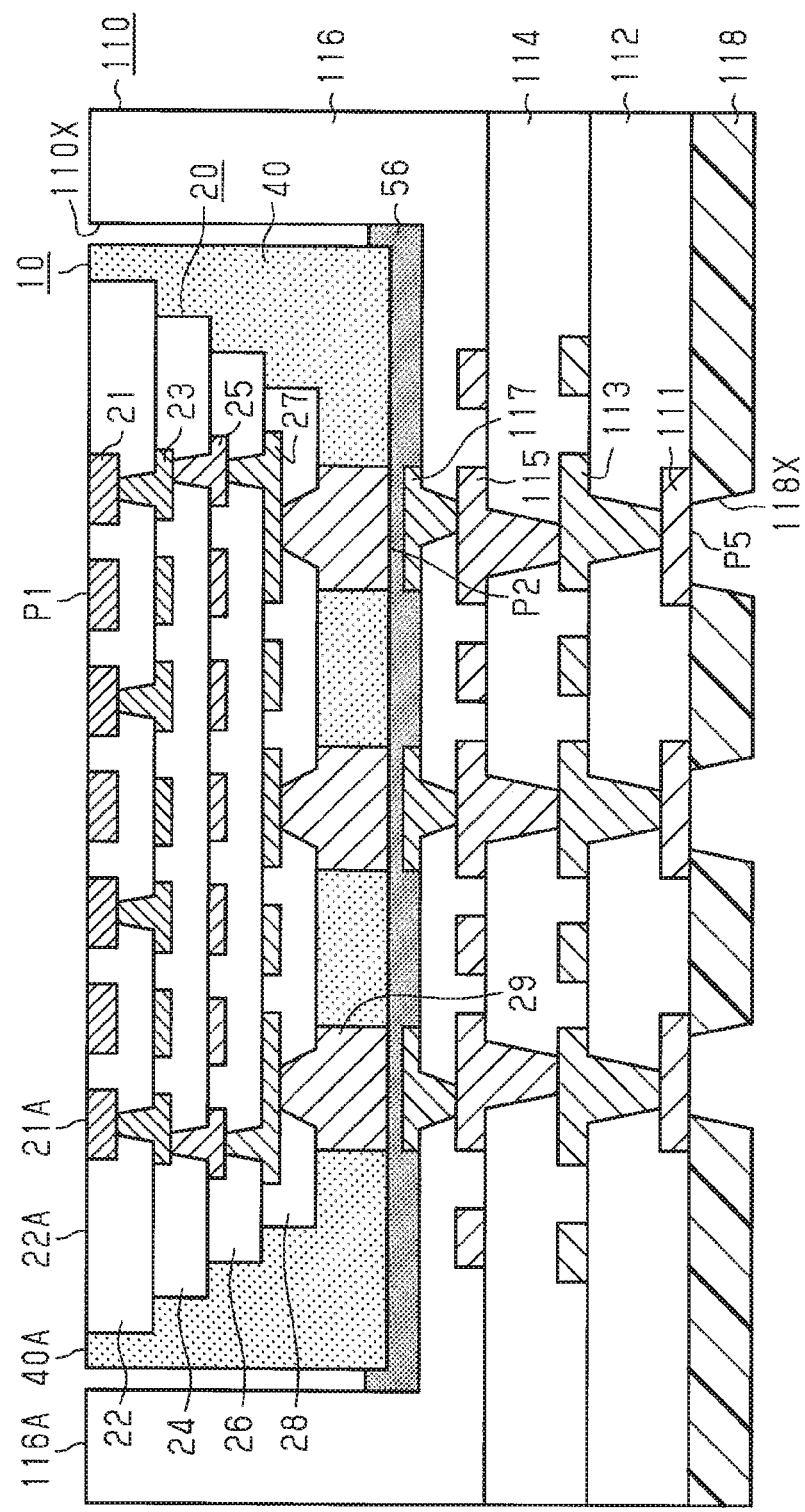
FIG. 30 is a schematic cross-sectional view illustrating a further modification of the semiconductor device.

With reference to FIG. 30, a wiring substrate 110 that includes a recess 110X may be mounted on the wiring substrate 10. A wiring layer 111, an insulation layer 112, a wiring layer 113, an insulation layer 114, a wiring layer 115, an insulation layer 116, and a wiring layer 117 are sequentially stacked in the wiring substrate 110. The wiring substrate 110 is a low-density wiring layer including wiring layers in a lower wiring density than, for example, the wiring substrate 10 (stack 20).

The material of the insulation layers 112, 114, and 116 may be a non-photosensitive insulative resin of which the main component is a thermosetting resin. The material of the insulation layers 112, 114, and 116 may be, for example, a thermosetting resin, such as an epoxy resin or a polyimide resin, or a resin material obtained by mixing a filler such as silica or alumina with such a thermosetting resin. The material of the insulation layers 112, 114, and 116 may be, for example, an insulative resin in which reinforcement material is added to a thermosetting resin. Further, the material of the wiring layers 111, 113, 115, and 117 may be, for example, copper or a copper alloy.

The insulation layers 112, 114, and 116 are thicker than the insulation layers 22, 24, 26, and 28 in the stack 20. The insulation layers 112, 114, and 116 may each have a thickness of, for example, approximately 30 to 70 µm. The wiring layers 111, 113, 115, and 117 are thicker than the wiring layers 21, 23, 25, 27, and 29 in the stack 20. The wiring layers 111, 113, 115, and 117 may each have a thickness of, for example, approximately 15 to 35 µm. The wiring layers 111, 113, 115, and 117 have larger wiring widths and wiring intervals than the wiring layers 21, 23, 25, 27, and 29 in the stack 20. The line-and-space (L/S) of each of the wiring layers 111, 113, 115, and 117 is, for example, approximately 20 µm/20 µm.

The insulation layer 112 covers the side surfaces and the upper surface of the wiring layer 111 and exposes the lower surface of the wiring layer 111. The lower surface of the insulation layer 112 is, for example, flush with the lower surface of the wiring layer 111.

A solder resist layer 118 covering the wiring layer 111 is formed on the lower surface of the insulation layer 112. The solder resist layer 118 includes openings 118X at given locations. The openings 118X extend through the solder resist layer 118 in the thickness-wise direction and partially expose the lower surface of the wiring layer 111 as external connection pads P5.

The wiring layer 113 is electrically connected to the wiring layer 111. The wiring layer 113 includes via wirings and wiring patterns. The via wirings extend through the insulation layer 112 in the thickness-wise direction. The wiring patterns are formed integrally with the via wirings and laid out on the upper surface of the insulation layer 112.

The insulation layer 114 is formed on the upper surface of the insulation layer 112. Further, the insulation layer 114 covers the wiring layer 113.

The wiring layer 115 is electrically connected to the wiring layer 113. The wiring layer 115 includes via wirings and wiring patterns. The via wirings extend through the insulation layer 114 in the thickness-wise direction. The wiring patterns are formed integrally with the via wirings and laid out on the upper surface of the insulation layer 114.

The insulation layer 116 is formed on the upper surface of the insulation layer 114 covering the wiring layer 115. The recess 110X is recessed at a given location in the upper surface of the insulation layer 116 toward the lower surface of the insulation layer 116. The recess 110X is deep enough to extend from the upper surface 116A of the insulation layer 116 to an intermediate position in the thickness-wise direction of the insulation layer 116.

The wiring layer 117 is formed on the inner bottom surface of the recess 110X. The wiring layer 117 is electrically connected to the wiring layer 115. The wiring layer 117 includes via wirings and wiring patterns. The via wirings extend through the insulation layer 116 in the thickness-wise direction. The wiring patterns are formed integrally with the via wirings and laid out on the inner bottom surface of the recess 110X.

The wiring substrate 10 is mounted on the wiring substrate 110 in the recess 110X of the wiring substrate 110. In the present example, the anisotropic conductive film 56 is used to mount the wiring substrate 10 on the wiring substrate 110. In detail, the wiring substrate 10 is accommodated in the recess 110X of the wiring substrate 110, and the anisotropic conductive film 56 electrically connects the connection pads P2 of the wiring substrate 10 to the wiring layer 117 of the wiring substrate 110.

A gap extends between the inner side surfaces of the recess 110X and the side surfaces of the wiring substrate 10 (outer side surfaces of insulation layer 40 in the example of FIG. 30). Further, a gap extends between the inner bottom surface of the recess 110X and the lower surface of the wiring substrate 10.

The wiring layers 111, 113, 115, and 117 and the insulation layers 112, 114, and 116 in the wiring substrate 110 of FIG. 30 may be changed or modified in relation to the number of layers or the wiring layout. For example, the wiring substrate 110 may be changed to a cored buildup substrate including a core substrate. Further, there is no limit to the method for mounting the wiring substrate 10 on the wiring substrate 110.

In the above embodiments, a single semiconductor chip 60 is mounted on the wiring substrates 10, 12, and 14. However, a plurality of semiconductor chips 60 may be mounted on the wiring substrates 10, 12, and 14. In this case, a combination of a logic chip and a memory chip may be mounted on the wiring substrates 10, 12, and 14.

Instead of the semiconductor chip 60, a chip component, such as a chip capacitor, a chip resistor, or a chip inductor, or an electronic component, such as a crystal oscillator, may be mounted on the wiring substrates 10, 12, and 14.

The mounting method of the semiconductor chip 60, a chip component, and an electronic component, such as a crystal oscillator (e.g., flip-chip-mounting, wire-bond mounting, solder mounting, mounting using anisotropic conductive film, and a combination of such mounting methods) may be changed or modified in any manner.

In the above embodiments, an intermediate substrate may be used to connect the wiring substrates 10, 12, and 14 to the electronic components mounted on the wiring substrates 10, 12, and 14. In this case, for example, the lower surface 29B of the lowermost wiring layer 29 in the stack 20 does not have to be exposed from the insulation layers 40 and 41.

In the above embodiments, the lowermost wiring layer 29 of the stack 20 is thicker than the other wiring layers 21, 23, 25, and 27 in the stack 20. For example, the lowermost wiring layer 29 may have the same thickness as the wiring layers 21, 23, 25, and 27 or be thinner than the other wiring layers 21, 23, 25, and 27.

In the above embodiments, single-piece manufacturing may be performed instead of batch manufacturing.

In the above embodiments, wiring layers and insulation layers are stacked on one side (lower surface) of the support substrate 200 to form the wiring substrate 10 or 14. Then, the support substrate 200 is removed to obtain a single wiring substrate 10 or 14 from each singulation region A1. Instead, wiring layers and insulation layers may be stacked on both sides (upper and lower surfaces) of the support substrate 200 to form the wiring substrate 10 or 14. Then, the support substrate 200 is removed to obtain a plurality of wiring substrates 10 or 14 from each singulation region A1.

In the second embodiment, the wiring substrate 10 is mounted and the insulation layers and wiring layers are stacked on one side (one surface) of the support substrate 210 to form the wiring substrate 12. Then, the support substrate 210 is removed to obtain a single wiring substrate 12 from each singulation region A3. Instead, for example, the wiring substrate 10 may be mounted and the insulation layers and wiring layers may be stacked on each of the two sides (upper and lower surfaces) of the support substrate 210 to form the wiring substrates 12. Then, the support substrate 210 is removed to obtain a plurality of wiring substrates 12 from each singulation region A3.

Clauses

This disclosure further encompasses the following embodiments.

1. A method for manufacturing a wiring substrate, the method including:
preparing a first support substrate;
forming a stack by alternately stacking a plurality of insulation layers and a plurality of wiring layers one upon another on the first support substrate, wherein the plurality of insulation layers are each formed from an insulative resin of which main component is a photosensitive resin;
forming a first insulation layer on the first support substrate, wherein the first insulation layer covers a lower surface of the stack and entirely covers a side surface of the stack; and
removing the first support substrate to expose an upper surface of an uppermost wiring layer of the plurality of wiring layers, an upper surface of an uppermost insulation layer of the plurality of insulation layers, and an upper surface of the first insulation layer.

2. The method according to clause 1, wherein:
the first support substrate includes a plurality of singulation regions, in which the wiring substrate is formed in each of the singulation regions;
the stack is formed on the first support substrate in each of the singulation regions; and
the first insulation layer fills a space between the stacks in adjacent ones of the singulation regions.

3. The method according to clause 1 or 2, further including:
after the first support substrate is removed, mounting the stack and the first insulation layer on a second support substrate that differs from the first support substrate so that the upper surface of the uppermost wiring layer, the upper surface of the uppermost insulation layer, and the upper surface of the first insulation layer contact the second support substrate;
forming a second insulation layer on the second support substrate, wherein the second insulation layer covers a lower surface of the first insulation layer and entirely covers a side surface of the first insulation layer;
forming a through hole in a lower surface of the second insulation layer, wherein the through hole exposes a lower surface of a lowermost wiring layer of the plurality of wiring layers;
filling the through hole with a via wiring;
forming a wiring pattern on the lower surface of the second insulation layer, wherein the via wiring electrically connects the wiring pattern to the lowermost wiring layer; and
removing the second support substrate.

4. The method according to clause 1 or 2, further including:
before the first support substrate is removed,
forming a through hole in a lower surface of the first insulation layer, wherein the through hole partially exposes a lower surface of a lowermost wiring layer of the plurality of wiring layers;
filling the through hole with a via wiring; and
forming a wiring pattern on the lower surface of the first insulation layer, wherein the via wiring electrically connects the wiring pattern to the lowermost wiring layer.

All examples and conditional language recited herein are intended for pedagogical purposes to aid the reader in understanding the principles of the invention and the concepts contributed by the inventors to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the scope of this disclosure.

The invention claimed is:

1. A wiring substrate comprising:
a stack including a plurality of insulation layers and a plurality of wiring layers, wherein each of the plurality of insulation layers is formed by an insulative resin of which main component is a photosensitive resin, and the plurality of insulation layers and the plurality of wiring layers are alternately stacked one upon another; and
a first insulation layer covering a lower surface of the stack and entirely covering a side surface of the stack, wherein the first insulation layer has a higher rigidity than the plurality of insulation layers,
wherein an upper surface of an uppermost wiring layer of the plurality of wiring layers and an upper surface of an uppermost insulation layer of the plurality of insulation layers are exposed from the first insulation layer;
a lowermost wiring layer of the plurality of wiring layers of the stack includes:
a via wiring extending through a lowermost insulation layer of the plurality of insulation layers of the stack; and
a metal post formed integrally with the via wiring and projecting downward from a lower surface of the lowermost insulation layer,
wherein the first insulation layer entirely covers and contacts a side surface of the metal post.

2. The wiring substrate according to claim 1, wherein an upper surface of the first insulation layer is flush with the upper surface of the uppermost wiring layer and the upper surface of the uppermost insulation layer.

3. The wiring substrate according to claim 1, wherein
the plurality of insulation layers include an upper insulation layer and a lower insulation layer that is vertically adjacent to the upper insulation layer,
the lower insulation layer is formed on a lower surface of the upper insulation layer and exposes a peripheral portion of the lower surface of the upper insulation layer, and
the first insulation layer entirely covers a side surface of the upper insulation layer, the lower surface of the upper insulation layer exposed from the lower insulation layer, and a side surface of the lower insulation layer.

4. The wiring substrate according to claim 1, wherein
a lower surface of the lowermost wiring layer of the plurality of wiring layers is exposed from the first insulation layer, and
the lowermost wiring layer is thicker than each of other ones of the plurality of wiring layers.

5. The wiring substrate according to claim 1, wherein
the upper surface of the uppermost wiring layer is flush with an upper surface of the first insulation layer, and
a lower surface of the lowermost wiring layer of the plurality of wiring layers is flush with a lower surface of the first insulation layer.

6. The wiring substrate according to claim 1, further comprising:
a second insulation layer exposing the upper surface of the uppermost wiring layer, the upper surface of the uppermost insulation layer, and an upper surface of the first insulation layer and entirely covering a lower surface of the first insulation layer and an outer side surface of the first insulation layer;
a through hole formed in a lower surface of the second insulation layer and partially exposing a lower surface of the lowermost wiring layer of the plurality of wiring layers of the stack;
a via wiring with which the through hole is filled; and
a wiring pattern formed on the lower surface of the second insulation layer and electrically connected by the via wiring to the lowermost wiring layer.

7. The wiring substrate according to claim 6, further comprising:
a wiring structure stacked on the lower surface of the second insulation layer, wherein the wiring structure includes
an insulation layer formed on the lower surface of the second insulation layer, wherein the insulation layer is formed by an insulative resin of which main component is a thermosetting resin, and
a wiring layer formed on the insulation layer.

8. The wiring substrate according to claim 6, wherein the second insulation layer includes a recess in which the stack and the first insulation layer are embedded, the recess including
an inner side surface that is in contact with the outer side surface of the first insulation layer, and
an inner bottom surface that is in contact with the lower surface of the first insulation layer.

9. The wiring substrate according to claim 6, wherein the second insulation layer is formed from a resin material that is the same as that of the first insulation layer.

10. The wiring substrate according to claim 1, wherein
the first insulation layer covers a lower surface of the lowermost wiring layer of the plurality of wiring layers,
the first insulation layer includes a through hole formed in a lower surface of the first insulation layer and partially exposing the lower surface of the lowermost wiring layer, and
the wiring substrate further comprising:
a via wiring with which the through hole is filled; and
a wiring pattern formed on the lower surface of the first insulation layer and electrically connected by the via wiring to the lowermost wiring layer.

11. The wiring substrate according to claim 10, further comprising
a wiring structure stacked on the lower surface of the first insulation layer, the wiring structure including:
wiring layers, an uppermost one of which including the wiring pattern;
insulation layers, each formed from an insulative resin of which main component is a thermosetting resin;
wherein the wiring layers and the insulation layers of the wiring structure are alternately stacked one upon another.

12. The wiring substrate according to claim 1, further comprising:
a second insulation layer including a recess accommodating the stack and the first insulation layer, wherein the recess exposes the upper surface of the uppermost wiring layer, the upper surface of the uppermost insulation layer, and an upper surface of the first insulation layer and includes
an inner side surface that is spaced apart from an outer side surface of the first insulation layer, and
an inner bottom surface that is spaced apart from a lower surface of the first insulation layer;
a first wiring pattern formed on the inner bottom surface of the recess;
an anisotropic conductive film that electrically connects the lowermost wiring layer of the plurality of wiring layers and the first wiring pattern;
a second wiring pattern including an upper surface and a side surface that are covered by the second insulation layer and a lower surface that is exposed in a lower surface of the second insulation layer; and
a via wiring extending through the second insulation layer from a lower surface of the first wiring pattern and the upper surface of the second wiring pattern to connect the first wiring pattern and the second wiring pattern.

* * * * *